United States Patent [19]

Sebok

[11] Patent Number: 4,910,460
[45] Date of Patent: Mar. 20, 1990

[54] METHOD AND APPARATUS FOR MAPPING EDDY CURRENTS IN MAGNETIC RESONANCE IMAGING

[75] Inventor: David A. Sebok, Plainsboro, N.J.

[73] Assignee: University of Medicine & Dentistry of New Jersey, Newark, N.J.

[21] Appl. No.: 280,144

[22] Filed: Dec. 5, 1988

[51] Int. Cl.[4] ............................................. G01R 33/20
[52] U.S. Cl. ....................................... 324/307; 324/300
[58] Field of Search ................ 324/300, 308, 307, 309, 324/310, 311, 312, 313, 314, 318, 319, 320, 322; 128/653

[56] References Cited

U.S. PATENT DOCUMENTS 4,701,706 10/1987 Haacke ................................ 324/307

Primary Examiner—Michael J. Tokar
Attorney, Agent, or Firm—Klauber & Jackson

[57] ABSTRACT

A method of mapping eddy currents in magnetic resonance imaging apparatus of the type having gradient coils and RF coils, the method including the steps of (a) applying a pulse sequence to the apparatus in a first excitation stage, including the steps of applying a first test gradient of a first polarity by the gradient coils; subsequently applying a first RF pulse of the first polarity by the RF coils; subsequently applying at least one first imaging gradient by the gradient coils; (b) measuring a first output signal in the first stage in response to the RF excitation pulse and the gradients; (c) subsequently applying a pulse sequence to the apparatus in a second excitation stage, including the steps of subsequently applying a second test gradient of a second polarity opposite to the first polarity by the gradient coils; subsequently applying a second RF pulse of the second polarity; subsequently applying at least one second imaging gradient by the gradient coils; (d) measuring a second output signal in the second stage in response to the second RF excitation pulse and the second gradients; and (e) processing the first and second output signals to produce a map of the eddy currents.

33 Claims, 21 Drawing Sheets

ALTERNATING RF EXCITATION PULSES

FIG. 9
ALTERNATING RF EXCITATION PULSES
AND ALTERNATING GRADIENTS
FIRST EXCITATION
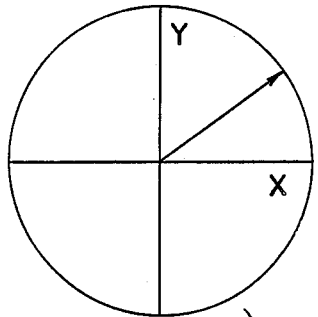
SECOND EXCITATION
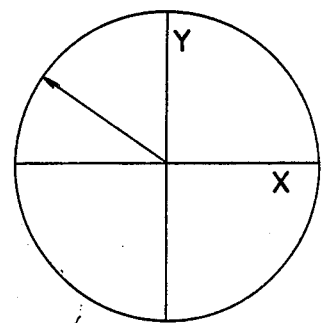
VECTOR SUM
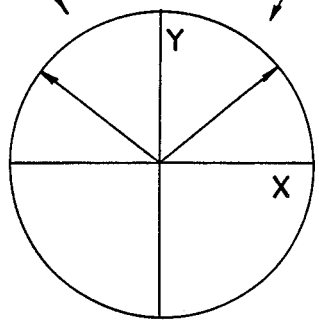
NET SIGNAL
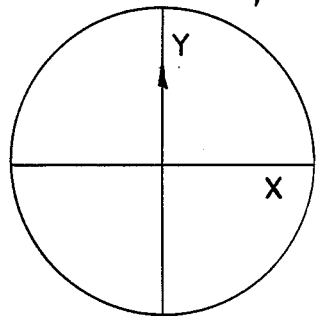
SIGNAL MAGNITUDE

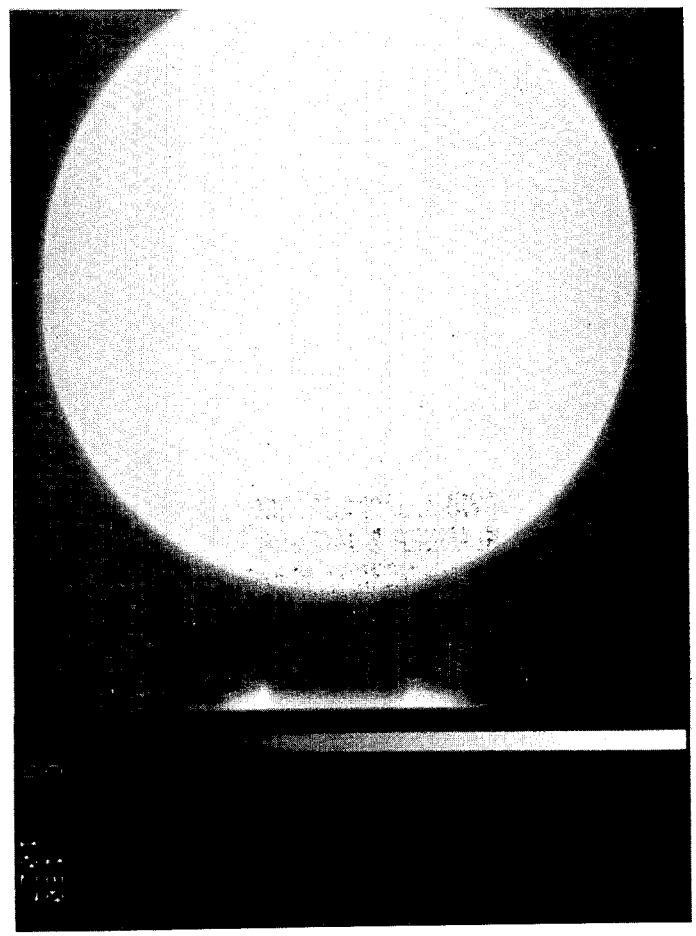
F I G. 10

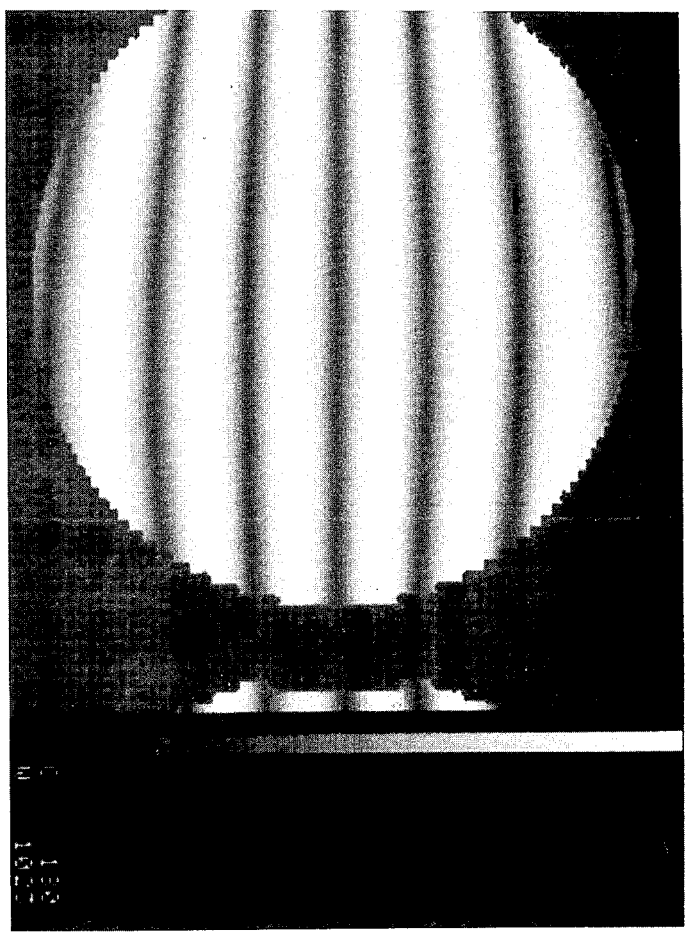
F I G. 11

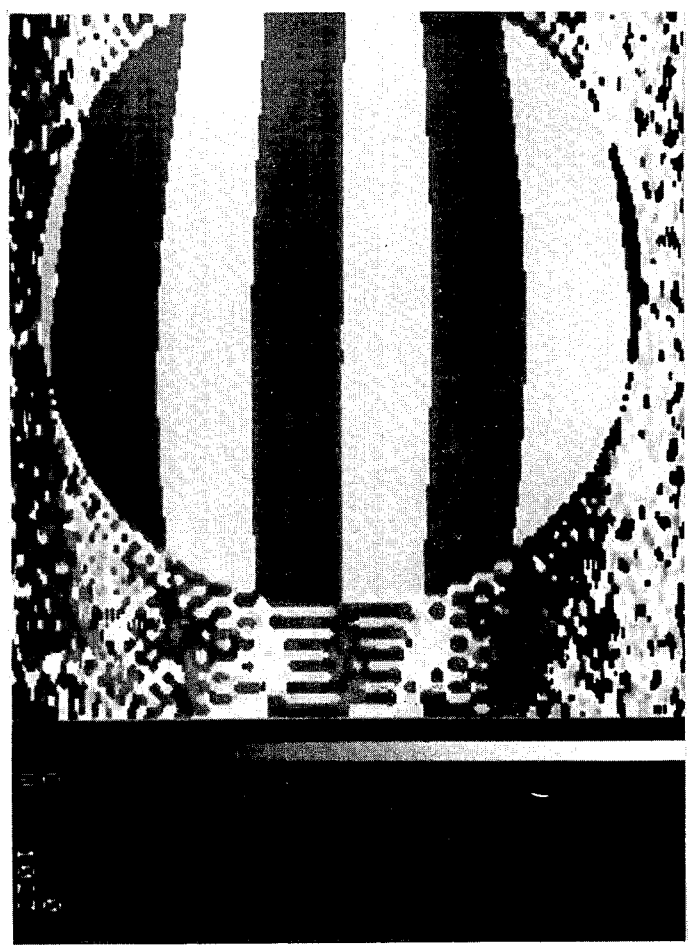
F I G. 12

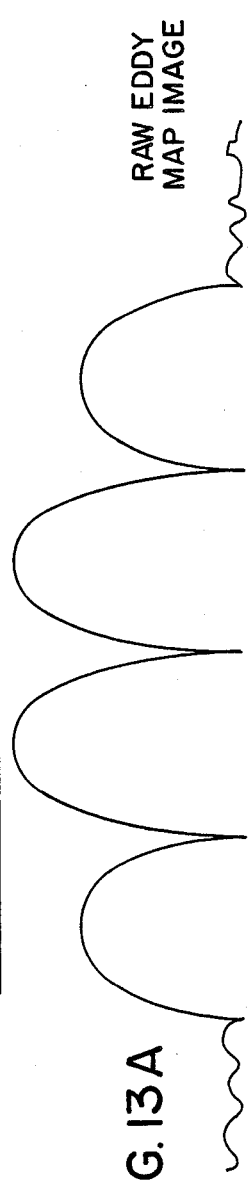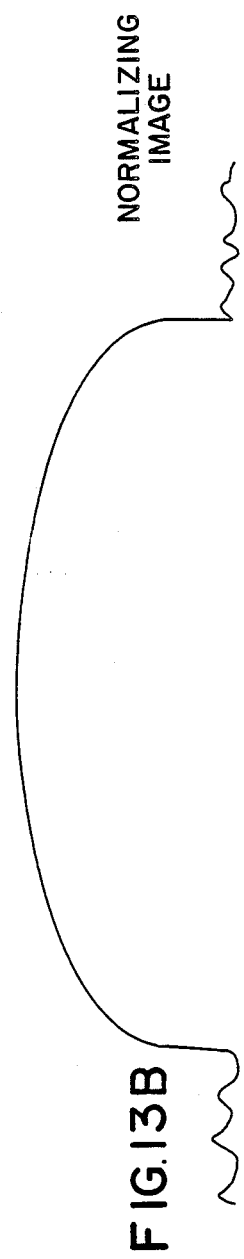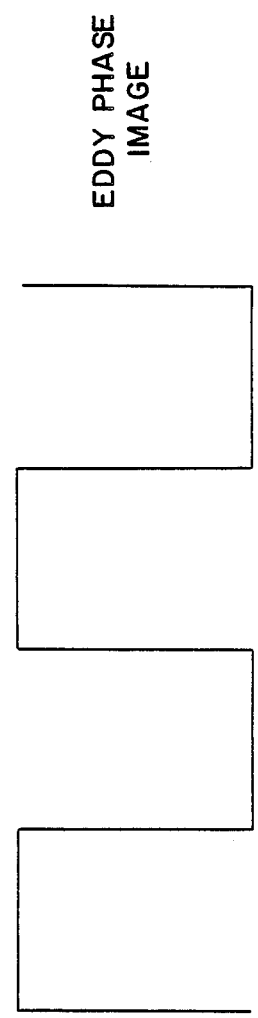
FIG.13A RAW EDDY MAP IMAGE
FIG.13B NORMALIZING IMAGE
FIG.13C EDDY PHASE IMAGE
ONE LINE OF DATA FROM THREE IMAGE FILES

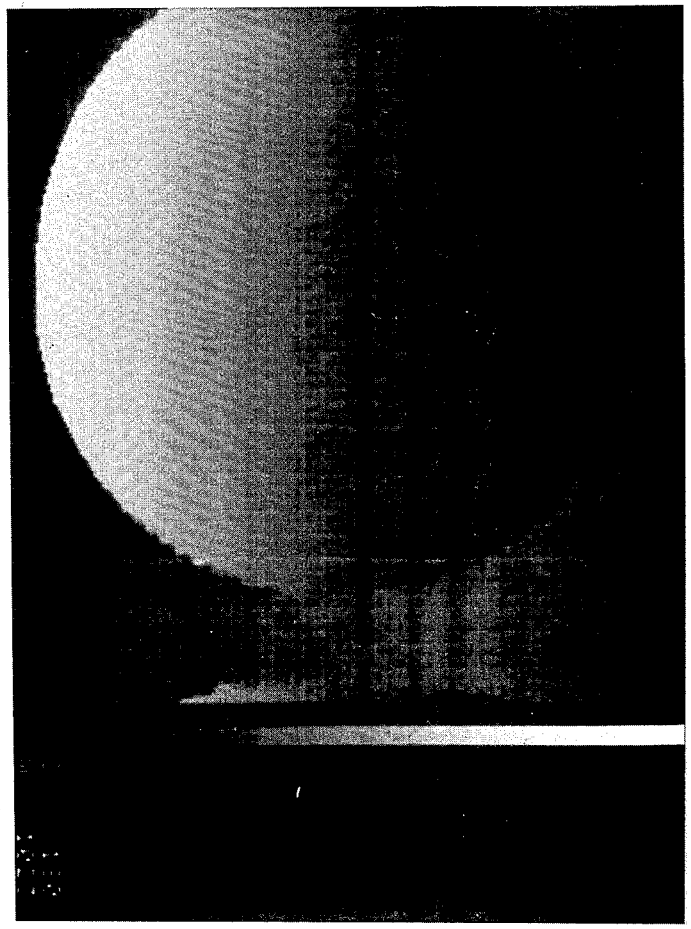
F I G. 19

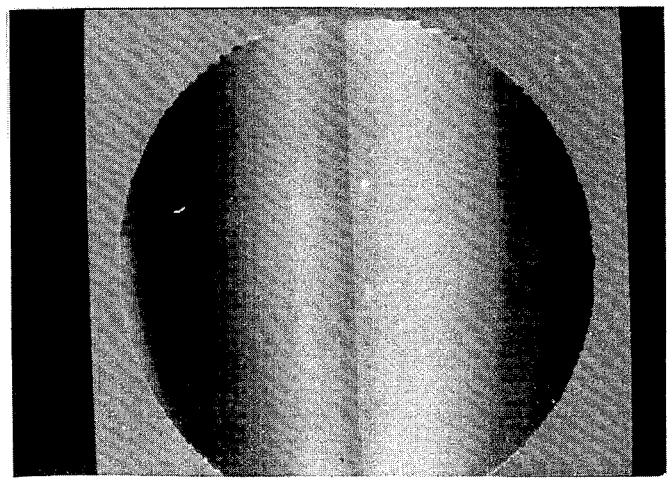
F I G. 20

METHOD AND APPARATUS FOR MAPPING EDDY CURRENTS IN MAGNETIC RESONANCE IMAGING

BACKGROUND OF THE INVENTION

This invention relates generally to magnetic resonance imaging (MRI), and more particularly, is directed to a method and apparatus for accurately mapping eddy currents with high resolution for use in producing a correction factor to compensate for such eddy currents.

Because of the use of x-rays with x-ray computer tomography (CT) scanning, which can be dangerous, the use of MRI or nuclear magnetic resonance (NMR) has been increasing in popularity. MRI provides safe interaction between radio frequency (RF) waves and certain atomic nuclei in the object, which may be a person, when the RF waves are placed in the presence of a strong magnetic field. Thus, MRI images can be diagnostically used in the same manner as x-rays, whereby abnormalities in the sizes and shapes of organs, and the like can be detected. In other words, with MRI, a picture image can be produced.

Specifically, MRI operates on the principle that each nucleus of protons and neutrons in certain elements, has a net spin. If the number of nuclear particles is even, their spins will cancel each other, leaving zero net spin. However, if there is an odd number of nuclear particles, a net spin other than zero will be produced. Because each nucleus is positively charged, it generates a small magnetic field when it spins. However, the magnetic moments produced by such spinning charged particles are randomly oriented.

When a magnetic field is applied, the spinning nuclei tend toward alignment with the applied field, that is, become "parallel" with the field. However, many of the nuclei do not reach perfect alignment with the field, but rather, are tilted at an angle to the field, thus behaving like tops or gyroscopes spinning under the force of gravity, that is, with the nuclei rotating or precessing in a conical manner about an axis in line with the applied magnetic field, as well as the nuclei spinning about their own axes. Thus, the nuclei have a component perpendicular to the main field known as the transverse component. The phase of this component will tend to be random. Thus, it will be appreciated that in the absence of external forces, the nuclei will tend to precess out of phase with each other.

However, the spinning nuclei eventually tend to line up in the direction of the applied magnetic field, because this is at a lower energy state. In such case, the nuclei are all in phase, that is, have phase coherence. In order for MRI to operate, the nuclei must be coherently tipped down away from such alignment toward the transverse plane, and this is accomplished by adding an RF pulse having a frequency which is the same as the natural precessional frequency of rotation of the rotating nuclei. Specifically, the RF pulse creates an RF field which rotates synchronously with the precessing spins. Accordingly, the nuclei move into a higher energy state in coherence at the resonant frequency, and thereby absorb energy. In this manner, transverse magnetization precesses around the axis of the external field, thereby inducing an AC signal, in a receiver coil, situated in a plane transverse to that of the external field. When the RF pulse is removed, the nuclei will return to the lower energy state which is in line with the magnetic field, and as they return, will emit energy. During such time, the transverse magnetization will decay to zero. Accordingly, such energy can be detected by the receiver coil in response to decay of the transverse magnetization. The signal measured externally will be the vector sum of the signal from all the individual nuclei.

In detecting the emitted RF signal, two time periods are of importance, and are termed the longitudinal relaxation time $T_1$ and the transverse relaxation time $T_2$. As discussed above, when the RF pulse is applied, the nuclei are in phase coherence in a plane 90° offset from the plane of the external field. As soon as the applied RF pulse is terminated, the nuclei are in phase with each other. Thereafter, in the absence of the RF pulse, the nuclei become out of phase with each other. Even though the energy of the individual nuclei has not changed, the externally measured signal, which is the vector sum of the individual nuclei, will decrease due to cancellation. The time necessary for the nuclei to become out of phase with each other, is the transverse relaxation time $T_2$.

After the lapse of time $T_2$, the time necessary for the nuclei to again align themselves with the magnetic field is termed the longitudinal relaxation tie $T_1$. Basically, time $T_2$ refers to the time necessary for the nuclei to lose coherence, while the time $T_1$ refers to the time necessary for any excess energy added by the RF pulse to totally dissipate and thereby provide for the return of the nuclei to the longitudinal state. Relaxation time $T_2$ is always shorter, and generally considerably shorter, than relaxation time $T_1$.

In the above discussion, time $T_2$ is the result of both tissue properties and magnetic inhomogeneities and is more properly referred to as $T_2^*$. The tissue $T_2$ effects cause random changes in phase. The magnet effects produce a controlled, constant shift on phase. In normal NMR spin echo (SE) imaging, a second RF pulse, termed the 180° pulse, is produced in order to invert the phase of the nuclei's signal. The interval between the first and second RF pulse is termed TE/2. If magnet effect have caused the phase to change at one point by $\Theta$ at time TE/2, the second RF pulse will change this to $-\Theta$. Then, at time TE (the echo time), the phase will be back to zero. Thus, the magnet's effect on phase will have been cancelled. This process can be repeated with third, fourth, etc. 180° RF pulses.

In regard to the above discussion, all that can be obtained from the externally measured RF signal is the amount of material that is present in the object and its mean relaxation times $T_1$ and $T_2$. In this regard, tissue discrimination, for example, can be provided by differences in times $T_1$ and $T_2$. Thus, by varying TE and TR parameters, the relative sensitivity to $T_1$, $T_2$ and proton density can be varied for detecting a particular tissue. However, there must also be spacial information with regard to where such object, such as an organ or the like, is located.

In this regard, an additional or gradient magnetic field is superimposed on the steady magnetic field in order to provide the spatial information. Generally, the strong steady magnetic field is applied by superconductor coils, while the gradient magnetic field is applied by resistive coils. Specifically, the gradient magnetic field is a gradually increasing or decreasing magnetic field along a given plane. Accordingly, the uniform magnetic field is modified so that it has a different value at each position of the object. Accordingly, if this gradient magnetic field is switched on during the period of data acquisition, there will be a linear variation in resonant frequency in accordance therewith.

Basically, in conventional magnetic resonance imaging, a series of two or more RF pulses and multiple gradient pulses in each of three orthogonal planes are produced concurrently in a complex fashion known as a pulse sequence. Typically, and as well known, 256 time points of data are acquired in the presence of an arbitrary x gradient of the main field in the course of each pulse sequence, thereby providing discrimination of 256 different locations along the x-axis. Simultaneously, a y magnetic gradient is used to encode each y location with a different predetermined phase. A plurality of y magnetic gradients are applied over the course of multiple phase encoding steps, with each being a complete pulse sequence, and with the complete set of all these acquisitions, y-axis resolution can be obtained. Typically, 128 different gradients or phase encoding steps will be performed. Thus, the final image will be a matrix of 32,768 (or 128×256) discrete points of information in the x-y plane.

In magnetic resonance imaging, from the above information, it is therefore well known to reconstruct a two-dimensional image, showing the object that has been scanned. Techniques for providing such reconstruction are well known, and are described, for example, in the book *Advanced Imaging Techniques, Vol. 2*, Chapter 3, "Physical Principles of Nuclear Magnetic Resonance by William G. Bradley et al., Clavadel Press, San Anselmo, CA 1983, pages 15-61; the booklet "Basic Principles of Magnetic Resonance Imaging" by Info-Scripts, Houston, Texas, 1986; a booklet "NMR A perspective on imaging" by General Electric Company, Medical Systems Group, Milwaukee, Wisconsin 53201, 1984; the text from a talk on "NMR in Medicine: A Brief Historical Review and Prospectus" by Paul C. Lauterbur, Department of Chemistry and Radiology, S.U.N.Y. at Stony Brook, given at the 4th annual conference on Integrated Body Imaging, Tokyo, Japan, Aug. 7-8, 1981; and the book *Magnetic Resonance Imaging*, Chapter 4, "Instrumentation" by David D. Stark et al, The C.V. Mosby Co., 1988, pages 56-65. The entire disclosures of all of the above references are incorporated herein by reference.

However, a problem occurs with eddy currents in magnetic resonance imaging. Such eddy currents are produced due to the presence of rapidly changing magnetic gradients, which occur normally with magnetic resonance imaging. Specifically, these gradient changes induce eddy currents in conductive surfaces which can exist either within the different coils or adjacent thereto. Accordingly, these eddy currents generate time and positional dependent fluctuations in the magnetic field, and thereby represent errors in the desired field distribution. See Page 59 of the Stark et al reference discussed above.

It will be appreciated that eddy current induced field errors have a sinister effect on all MRI techniques. Specifically, magnetic resonance imaging assumes that the magnetic field is in a well-defined state at every point in time. Violation of this assumption leads to improperly shaped slices and accumulated phase errors. As a result, artifacts will be produced, along with a loss of contrast in the image.

Accordingly, various systems have been proposed for compensating for such eddy current errors. Generally, in commercial MRI systems, compensation is provided by shaping the characteristics of the gradient amplifier used to produce the gradient magnetic field. Such compensation is provided by a complex feedback loop. This method is both difficult to adjust and cannot completely cancel all linear errors. An example of such a system is disclosed in the article "Reduction of pulsed gradient settling time in the superconducting magnet of a magnetic resonance instrument" in the periodical "Medical Physics", by Jensen et al, Vol. 14, No. 5, September/October 1987, pages 859-862. Other references which discuss eddy currents in NMR imaging are found in the article "Real-Time Movie Imaging from a Single Cardiac Cycle by NMR" by B. Chapman et al in the periodical "Magnetic Resonance in Medicine, 5, pages 246-254 (1987) in which the characteristics of the gradient amplifiers are modified by a filter; and the article "Exact Temporal Eddy Current Compensation in Magnetic Resonance Imaging Systems" by Michael A. Morich et al in the periodical "IEEE Transactions on Medical Imaging", Vol. 7, No. 3, September 1988, pages 247-254 in which eddy currents are compensated by a time-varying polynomial from a single sense coil using a matrix analysis. Another article relating NMR magnetic behavior is found in "A General Method of Design of Axial and Radial Shim Coils for NMR and MRI Magnet" by E.S. Bobrov in the periodical "IEEE Transactions on Magnetics", Vol. 24, No. 1, January, 1988, pages 533-536. Articles relating generally to eddy currents are "Recent Development in Eddy Current Analysis" by A. Krawczyk et al in "IEEE Transactions on Magnetics", Vol. Mag-23, No. 5, September, 1987, pages 3032-3037; "Eddy Current Transients and Forces in Cyrostat Walls of Superconducting Solenoids" by G. Ries in "IEEE Transactions on Magnetics", Vol. 24, No. 1, January, 1988, pages 516-519; and "Efficient Solving Techniques of Matrix Equations for Finite Element Analysis of Eddy Currents" by Nakata et al in "IEEE Transactions on magnetics", Vol. 24, No. 1, January, 1988, pages 170-173.

In order to provide such eddy current compensation, it is necessary to first map the eddy currents, and then to correct the same with, for example, such feedback compensation.

It will be appreciated that it is extremely difficult to examine eddy induced errors created by a single gradient state change. Since a typical sequence has multiple gradient pulses, it is difficult to separate the eddy affects of one from another. Further, eddy currents can last for a few seconds. Thus, the effects of a gradient pulse can linger over several excitations.

Another problem with measuring eddy currents is the small size of their effects compared to the overall signal. Thus, an effective mapping technique needs to be able to separate eddy current effects from all other effects, and yet produce results that are distinguishable from noise.

According to one known system for mapping eddy currents, two sense coils parallel to a particular gradient axis have been provided. The outputs from the two sense coils are subtracted and then integrated to produce an output which is a time-varying representation of the linear component of the gradient field and which can be used to compensate for eddy currents so that the gradient field approaches the desired shape. However, this system has various disadvantages.

First, there are only two coils, and accordingly, the magnetic field is only sampled at two points. Thus, the change in magnetic field is represented by a linear slope extending through the two coils. However, such change in the magnetic field is generally not linear, and for example, may include higher order terms. Therefore, an accurate representation of the changes in the magnetic field cannot be determined. In order to be truly accurate, this method would require a prohibitively large number of coils. However, because of space requirements, such large number of coils could not be accommodated, and in addition, would themselves influence the field.

Secondly, there is difficulty in setting up the two coils. Generally, a separate test fixture containing the coils is required, and such set-up time may take upwards of one hour, while the measurement time may take upwards of seven hours. This means that the apparatus must be shut down during this time. It will be appreciated that MRI apparatus generally results in revenue up to and possibly more than two thousand dollars per hour, and accordingly, such loss of time results in a great loss of revenue.

A technique for creating higher resolution maps of eddy currents has recently been proposed by Y.S. Kim and Z.H. Cho in an article "Eddy-Current-Compensated Field-Inhomogeneity Mapping in NMR Imaging" published in the Journal of Magnetic Resonance, pages 459-471, 1988, the entire disclosure of which is incorporated herein by reference. Accordingly to Kim and Cho, a third dimension representing eddy-induced errors is phase encoded. Accordingly, they provide an indication of the complex nature of eddy currents. However, the spatial resolution with this method is limited by the number of eddy phase steps, and in addition, because it is a three dimensional technique, it is extremely time consuming.

OBJECTS AND SUMMARY OF THE INVENTION

Accordingly, it is an object of the present invention to provide a system for accurately mapping eddy currents produced in magnetic resonance imaging.

It is another object of the present invention to provide a system for easily mapping such eddy currents without shutting down the MRI apparatus for long periods of time.

It is still another object of the present invention to provide a system for accurately mapping eddy currents by modifying a conventional pulse sequence by adding a test gradient before the first RF pulse.

It is yet another object of the present invention to provide a system for easily assessing higher order eddy currents in magnetic resonance imaging.

It is a further object of the present invention to provide a system for assessing variation of eddy currents as a function of cross-coupling between orthogonal coils.

In accordance with an aspect of the present invention, a method of mapping eddy currents in magnetic resonance imaging apparatus of the type having gradient coils and RF coils, includes the steps of (a) applying a pulse sequence of at least two stages to the each stage including the steps of applying an RF excitation pulse by the RF coils; and subsequently applying at least one imaging gradient by the gradient coils; (b) applying a test gradient by the gradient coils in at least one stage before the RF excitation pulse in the stage, such that at least two test gradients are different when a test gradient is applied in at least two stages; (c) subsequently measuring an output signal in each stage in response to said RF excitation pulses and said gradients; and (d) processing the output signals from all stages to produce a map of the eddy currents, the step of processing including the step of complex scaling and vector adding the output signals from all of the stages, the complex scaling being such that vector adding the output signals from each stage in the absence of all test gradients would produce a signal having zero magnitude.

The above and other objects, features and advantages of the present invention will become readily apparent from the following detailed description which is to be read in connection with the accompanying drawings.

BRIEF DESCRIPTION OF THE DRAWINGS

The file of this Patent contains at least one drawing executed in color. Copies of this Patent with color drawing(s) will be provided by the Patent and Trademark Office upon request and payment of the necessary fee.

FIG. 9 is a phase diagram showing the vector addition of two output signals according to the present invention where a normal MR pulse sequence is modified to have alternating RF pulses and alternating test gradients;

FIG. 10 is a photograph of the normalization magnitude image produced by a normal two average spin echo sequence;

FIG. 11 is a photograph of the eddy-sensitive magnitude image in accordance with the present invention;

FIG. 12 is a photograph of the eddy-sensitive phase image in accordance with the present invention;

FIG. 13A is a waveform diagram o one line of data from the eddy-sensitive magnitude image of FIG. 11;

FIG. 13B is a waveform diagram of one line of data from the normalization magnitude image of FIG. 10;

FIG. 13C is a waveform diagram of one line of data from the eddy-sensitive phase image of FIG. 12;

FIG. 19 is gray-scale photograph of the time integral eddy induced field error map of FIG. 18;

FIG. 20 is a color photograph of the time integral eddy induced field error map of FIG. 18.

DETAILED DESCRIPTION OF THE PREFERRED EMBODIMENTS

Figure 1:
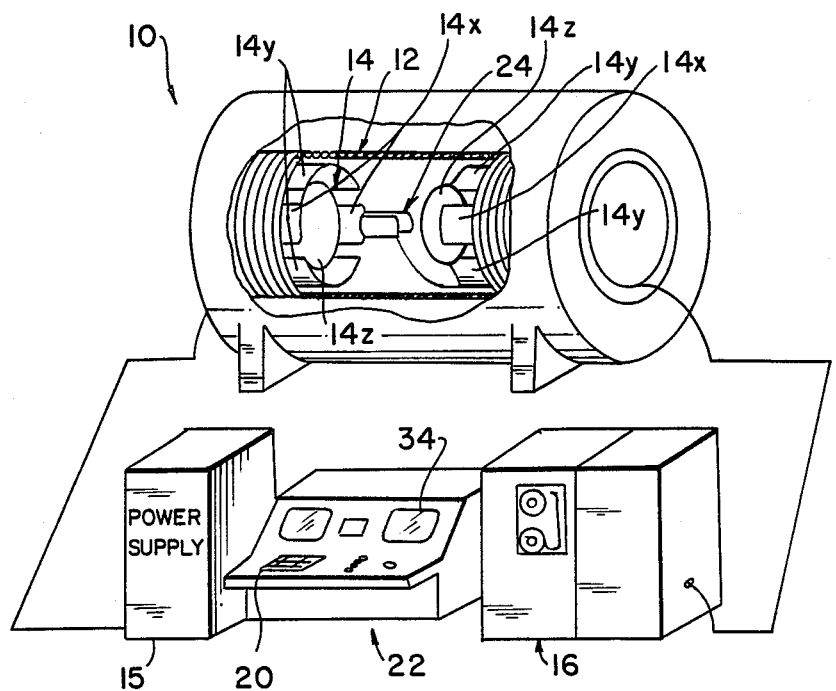
FIG. 1 is a schematic diagram of MRI apparatus with which the present invention can be used.
Figure 2:
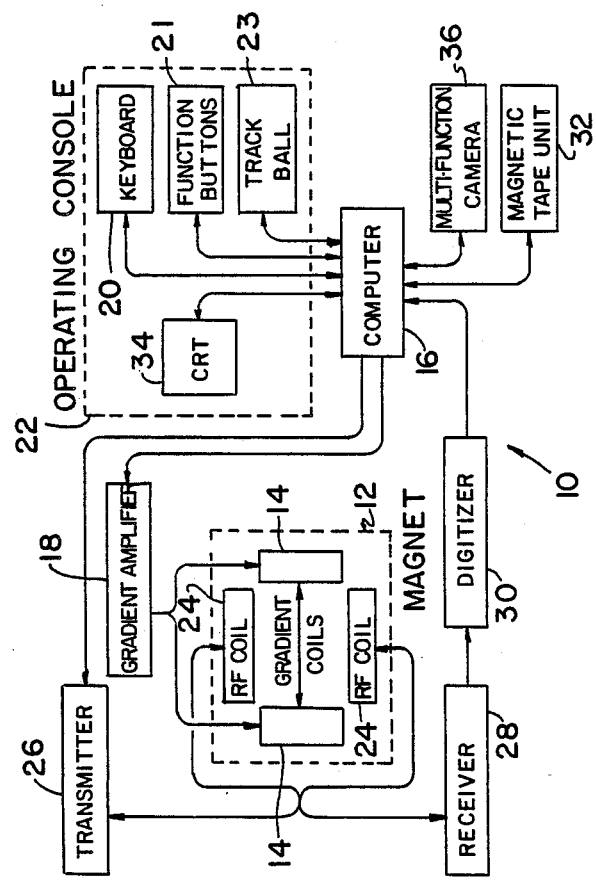
FIG. 2 is a block diagram of the MRI apparatus of FIG. 1.

Referring to the drawings in detail, and initially to FIGS. 1 and 2 thereof, there is shown a functional block diagram of MRI apparatus 10 with which the present invention can be used. Such apparatus 10 is described at pages 24–26 of the aforementioned General Electric article.

More specifically, MRI apparatus 10 includes a magnet 12 which generates the static magnetic field that is required for polarization of the nuclei. Generally, magnet 12 will be a superconducting magnet. This has the advantage of allowing for very high current densities, therefore enabling generation of very high magnetic fields, for example, up to 2 Tesla, which is approximately ten times the field generated by the most powerful resistive air-core systems. All superconducting magnets have their fields directed along the bore of the magnet and parallel to the longitudinal axis of the subject. However, it will be appreciated that other magnets, such as electrically excited air-core resistive magnets, iron core permanent magnets and the like can also be used, depending upon the desired bore size, strength and uniformity of the magnetic field. Practical considerations include magnet size, weight, cost and availability.

In order to apply the aforementioned magnetic gradient field, gradient coils 14 are provided. Generally, gradient coils 14 include three sets of orthogonal D.C. coils, generating magnetic gradients in three orthogonal directions. Thus, tilted gradient fields can be produced by combining two or three of the orthogonal sets of D.C. coils. The three sets of x, y and z gradient coils are denoted by $14x$, $14y$ and $14z$ in FIG. 1. Only one such set is shown in FIG. 2. The gradient coils 14 are driven by their own power supply 15 and can be switched by a computer 16 through a respective gradient amplifier 18 connected between computer 16 and each set of gradient coil 14. Computer 16 can be operated by a keyboard 20, function buttons 21 and/or a track ball 23 of an operating console 22.

Gradient coils 14 lie inside the bore of magnet 12 and produce a magnetic field with a linear spatial variation, as discussed above. Typical values of the gradient fields are on the order of 1–10 mT/m (0.1–1 gauss/cm). Because the gradient fields merely modify an existing magnetic field, their magnetic fields do not have to be as strong nor as uniform as the main magnetic field produced by magnet 12. As discussed above, the gradient magnetic fields are used to provide the positional information for forming the resultant images.

MRI apparatus 10 further includes RF coils 24. The shape of the RF coils 24 is determined by the type of magnet chosen to produce the main magnetic field. Thus, if the main field is along the axis of the body of a person, as in a solenoidal or a horizontal four-coil magnet, then saddle-shaped RF coils can be used, as shown in FIG. 1. If the main magnetic field is perpendicular to the axis of the body of the person, for example, for an iron-core magnet or a turned four-coil air-core magnet, then the RF field can be created by a simple solenoid coil.

RF coils 24 are operated in a dual capacity. First, as discussed above, RF coils generate the first and subsequent RF pulses necessary for the excitation of the magnetization, that is, for inducing transverse magnetization. In such case, RF coils 24 function as a transmitter o RF signals. The field produced by these signals is approximately 5 $\mu$T, which corresponds to about 1–8 msec for a selective 90° pulse. The need for precise timing for the RF pulses, as well as the complex waveforms used requires that this process be under computer control. Accordingly, as shown in FIG. 2, computer 16 controls RF coils 24 through a transmitter 26 which produces a highly stable RF signal and amplifies it to a level suitable for pulsed excitation.

RF coils 24 can also function as a pick-up device. Alternatively, the generating RF coils can be different than the pick-up coils. In this regard, small microvolt signals induced in RF coils 24 are supplied to a receiver 28 where the signals are amplified first in a preamplifier (not shown) thereof, and then mixed down to a band of audio frequencies in one or two mixing stages (not shown), each providing gain. This is performed in order to improve the signal-to-noise ratio of the induced signals. The signals from receiver 28 are then supplied to an analog-to-digital converter or digitizer 30, and then to computer 16 for analysis thereof.

It will be appreciated that, regardless of the imaging technique that is used, a large amount of data must be collected. Since such data may exceed the memory capacity of computer 16, the raw data can therefore, prior to processing, be routed to a storage device, such as a high density disc, a magnetic tape unit 32 or the like.

The last stage is the computation of each of the pixels of the image by computer 16, and such processing is conventional and is described in the aforementioned reference. Thereafter, an image is produced from the different pixels on a cathode ray tube (CRT) 34 on operating console 22, and then photographed on film by a multi-format camera 36 for permanent storage and interpretation.

Figure 4:
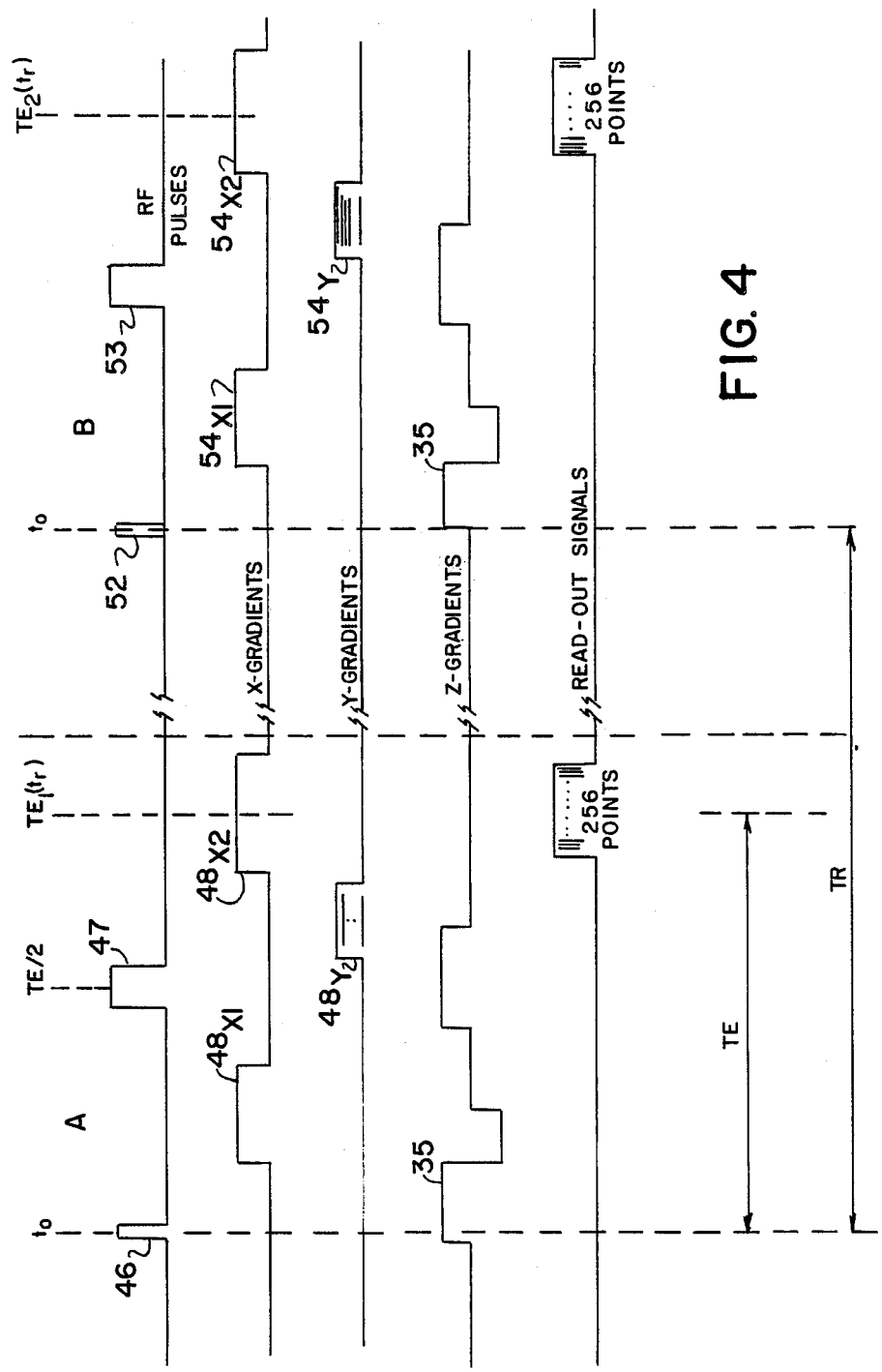
FIG. 4 is a waveform diagram of gradient and RF pulse sequence used in the prior art.

MRI apparatus 10 has conventionally been operated in accordance with the aforementioned discussion. Specifically, as shown in FIG. 4, a first RF pulse 46 is supplied to RF coils 24 in the presence of a slice selection gradient 35. Subsequently, a sequence of imaging gradient pulses $48_{x1}$, $48_{x2}$ and $48_y$ are delivered to gradient coils $14_x$ and $14_y$ and an RF pulse 47 is delivered to RF coils 24 in a controlled manner.

Figure 3A:
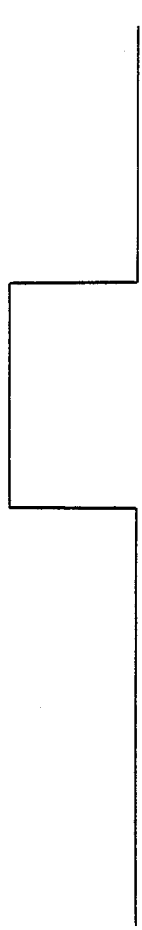
FIG. 3A is a waveform diagram of a gradient pulse that can be used in the prior art.
Figure 3B:
FIG. 3B is a waveform diagram of an RF pulse used in conjunction with the gradient pulse of FIG. 3A, and showing the time sequence therebetween.
Figure 3C:
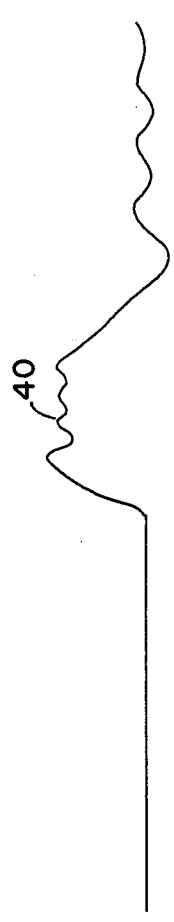
FIG. 3C is a waveform diagram of the gradient of the magnetic field produced with the pulse of FIG. 3A, with overshoot portions that occur because of eddy currents.

For example, a square wave signal, with sharp corners, shown in FIG. 3A, is applied to the gradient coils. As a result, the gradient of the magnetic field has overshoot portions at its leading and trailing edges, as shown in FIG. 3C. These overshoots at the leading and trailing edges thereof are caused by the aforementioned undesirable eddy currents. As a result, there is a distortion in the field in the time period TE between the application of the RF excitation pulse and the acquisition or measurement time, which distorts the output signal, and can therefore give erroneous readings. Therefore, according to the above-described proposals, it has been attempted to measure the eddy currents and then compensate for the same by changing the characteristic of gradient amplifiers 18, for example, by use of appropriate feedback. An example thereof is discussed in the aforementioned article "Reduction of pulsed gradient settling time in the superconducting magnet of a magnetic resonance instrument" in the periodical "Medical Physics", Vol.. 14, No. 5, September/October, 1987, Pages 859–862, the entire disclosure of which is incorporated herein by reference. The problem, however, is accurately measuring the eddy currents. If the eddy currents are not accurately measured, then appropriate correction cannot be obtained.

Therefore, as will now be discussed, the present invention provides a system of accurately measuring and mapping the eddy currents in an easy, economical manner, that is, with little down time of MRI apparatus 10.

Before discussing the invention in detail, however, a simplified view of a preferred embodiment of the present invention will first be given. Specifically, in accordance with the present invention, and as shown in the waveform diagram of FIG. 5 two excitation stages A and B are provided. In the first excitation stage A, a positive test gradient 44 is first applied by gradient coils 14x, followed by a positively phased 90° RF pulse 46 by RF coils 24, a positively phased 180° RF pulse 47 by RF coils 24, and a plurality of imaging gradients 48 by gradient coils 14. In the second excitation stage B, a negative test gradient 50 is applied by gradient coils 14x, followed by a negatively phased 90° RF pulse 52 by RF coils 24, a positively phased 180° RF pulse 53 by RF coils 24, and by a plurality of imaging gradients 54. The time between the end of test gradient 44 and 50, and RF excitation pulses 46 and 52, respectively, is under user control. In order to avoid uncertainties as to the effect of time-varying eddy currents during the period of slice selection, it is preferable that the 90° RF pulses 46 and 52 be a square wave pulse of minimum duration, for example, approximately 200 μsec. Further, it will be appreciated that slice selection is performed only by the 180° RF pulses 47 and 53, and accordingly a soft gaussian of 1-8 msec duration is preferably used. The height and width of the test gradients 44 and 50 can be varied. However, in order to concentrate on a single event, the pulse width thereof is made large. Typically, above 50 msec, little additional change was noticed.

It will be appreciated that although the previous discussion assumes that the logical x-direction corresponds only to the physical x-direction gradient coils 14x, alternatively the logical x-direction ca be defined in any arbitrary direction, and by an appropriate combination of physical gradient coils. Thus, test gradients can be produced by the x-direction gradient coils 14x and/or y-direction gradient coils 14y and/or z-direction gradient coils 14z.

As another alternative, the test gradient can be a logical y-direction gradient. In such case, for example, a y-direction test gradient 55 shown in dashed lines in FIG. 5 could be applied without any test gradient 44.

Measurements by the receiver RF coils are taken at times $TE_1$ and $TE_2$ after the 90° RF excitation pulses 46 and 52 have been applied, so as to obtain two time-displaced RF signals. Then, the signals are added using vector addition, that is, by combining magnitude and phase. If no eddy currents are present, the resultant signal will be zero. If eddy currents are present, the resultant signal is related to the integral of the residual eddy induced field error still present between the RF excitation pulse and the time of signal measurement. Accordingly, the residual effect on the MR signal due to eddy currents can be isolated to obtain an acurate mapping of the eddy currents. It will therefore be appreciated that the preferred embodiment of the present invention discussed above provides an eddy current field error mapping pulse sequence that is a modification of a normal spin echo sequence conventionally used in magnetic resonance imaging.

The theory behind the present invention will now be discussed in detail.

A normal MRI pulse sequence includes an RF excitation pulse. Prior to this RF pulse, the nuclei (protons) are all lined up parallel with the z-axis and have no phase. After this pulse is applied, each nuclei is imparted with a spin in the x-y plane, and each spin has a phase angle associated therewith which is defined within the rotating frame of reference of the spinning nucleus. Since gradient coils 14 impart a gradient field to the nuclei, the spin of each nucleus will be subjected to a range of magnetic field fluctuations resulting from the gradient coil pulses. As discussed above, these field fluctuations not only include the desired gradient induced field changes, but also the eddy current induced field errors, and the final phase a readout is the sum of all of these effects, that is, the post-excitation time integral of the field error.

Thus, if the gradient 40 of the magnetic field (FIG. 3C) occurs anytime in the period TE between the RF excitation pulse 42 (FIG. 3B) and the acquisition or measurement time, any residual field error caused by eddy currents will have an effect on the final phase of the read out signal.

It will be appreciated that each gradient change causes eddy induced field errors. Therefore, there is a first problem that because there is a single MRI pulse sequence having many different gradient changes, it is difficult to isolate the eddy currents of a single gradient change. There is also a second problem in that it is difficult to isolate the desired field distribution from errors in the field. Accordingly, prior art methods of measuring the eddy induced field errors have not been so accurate.

Figure 6:
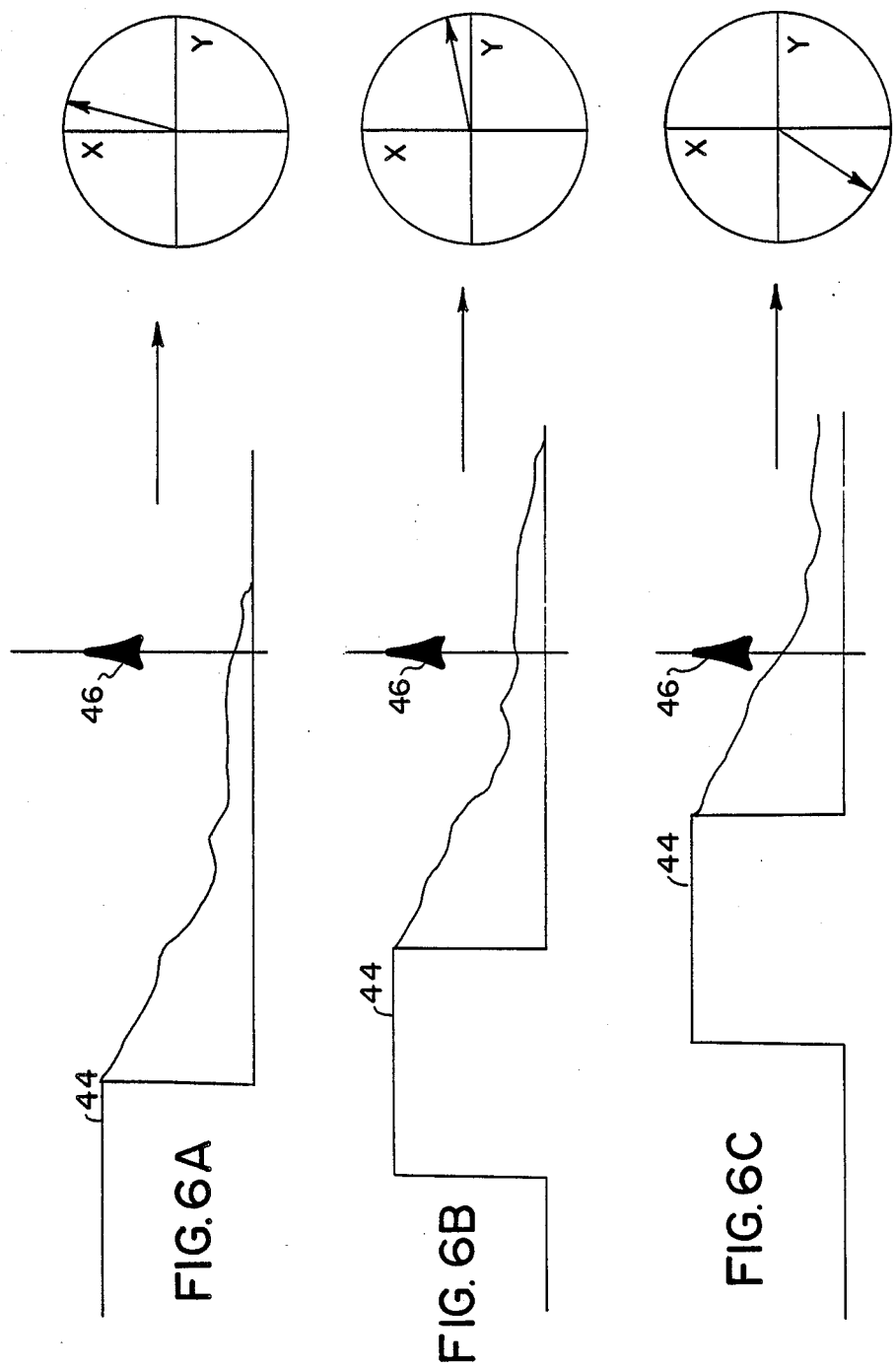
FIG. 6A is a waveform and phase diagram showing a relation between the tale end of a test gradient of a magnetic field and an RF pulse.
FIG. 6B is a waveform and phase diagram showing a different relation between the tale end of a test gradient of a magnetic field and an RF pulse.
FIG. 6C is a waveform and phase diagram showing a different relation between the tale end of a test gradient of a magnetic field and an RF pulse.

In accordance with the present invention, in order to isolate the eddy effects of a single gradient change and thereby overcome the first problem, test gradients 44 and 50 are placed outside of the MRI pulse sequence. As a result, only the "tail" part of the test gradients 44 and 50 that still exist after the RF excitation pulses 46 and 52, respectively, are applied, will have any effect on the final phase. The amount of effect will depend on the distance between the test gradient and the RF excitation pulse, in accordance with the three examples of FIGS. 6A–6C. In such case, the actual phase error is the time integral of the field error and is given by the following equation which represents the net phase change that has accumulated by the time the data is acquired:

$$\Delta\Phi = 2\pi\gamma \int \Delta B_0(t)dt \qquad (1),$$

where $B_o$ is the error in the main field at any point in time, and $\gamma$ is the gyro magnetic ratio, that is, the relationship between magnetic field and frequency. The integral is taken in the time period TE, starting from the RF excitation pulse and ending at the acquisition center.

As to the second problem of separating the eddy induced phase from other sources of phase errors, the present invention uses a sequence in which two excitation stages A and B with oppositely phased RF excitation pulses 46 and 52 are used and the resultant signals obtained at times $TE_1$ and $TE_2$ are combined with complex vector addition.

Figure 7:
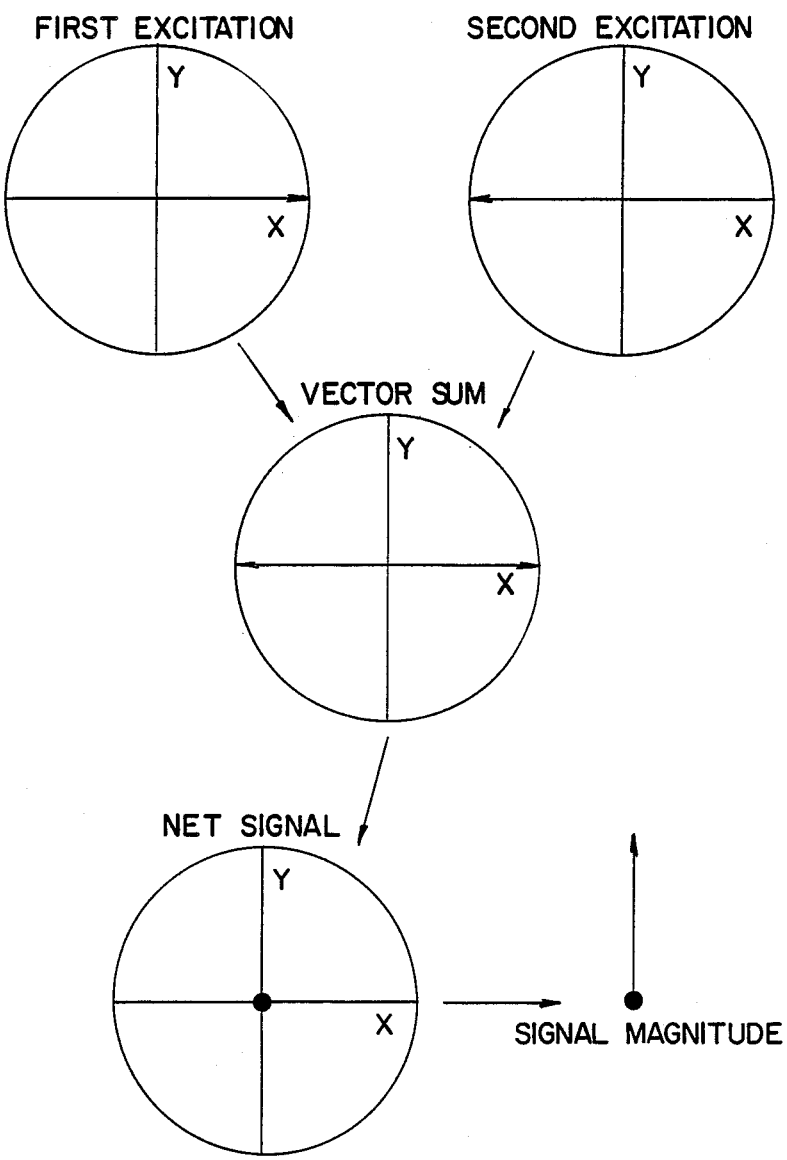
FIG. 7 is a phase diagram showing the vector addition of two output signals when a normal MR pulse sequence is modified to have alternating RF excitation pulses.

In this regard, it will be appreciated that if an alternating RF excitation pulse is added to a normal spin echo sequence, and two signals measured for each RF excitation pulse are added, the phase will be along the x-axis, but in opposite directions, and accordingly, the vector sum produces a resultant signal which is zero, as shown in FIG. 7.

Figure 8:
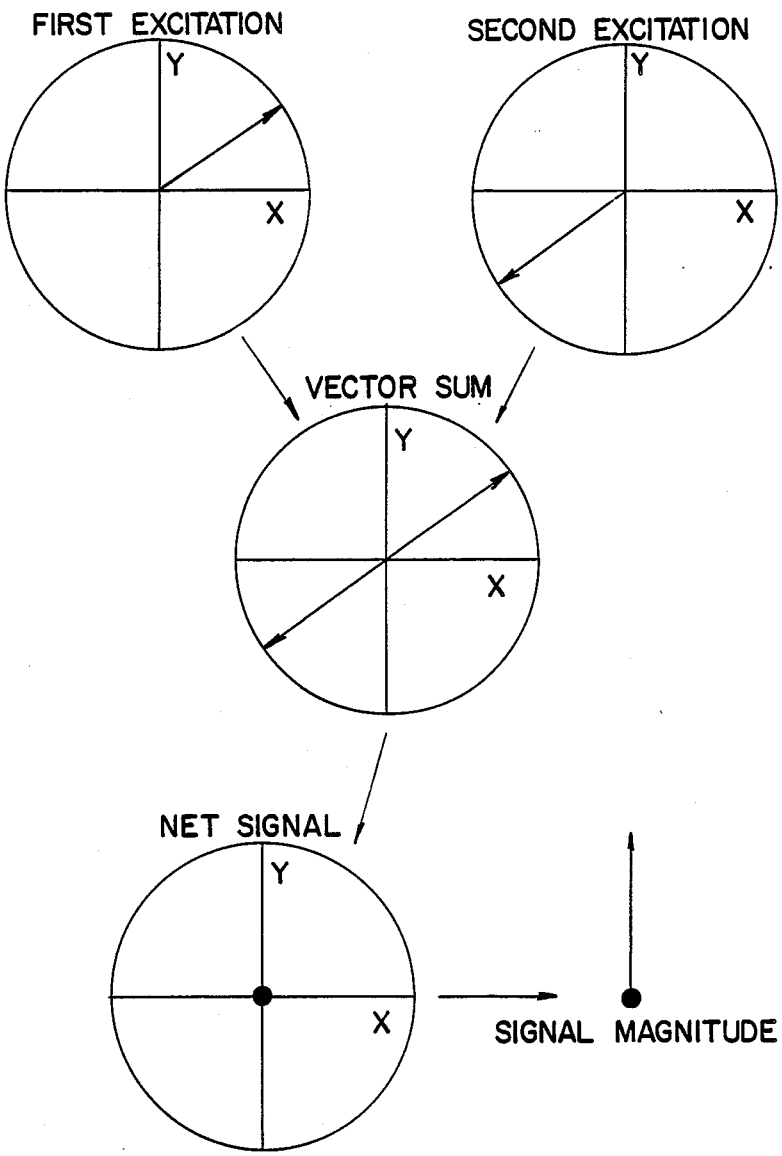
FIG. 8 is a phase diagram showing the vector addition of two output signals when a normal MR pulse sequence is modified to have alternating RF excitation pulses and test gradients of the same polarity.

In like manner, if the two excitation stages A and B discussed above, have the same polarity test gradient, that is, two test gradients 44, but oppositely phased RF excitation pulse polarities, as with RF pulses 46 and 52, added phase errors will all be in the same direction and the signals will cancel, as shown in FIG. 8. In such case, the residual field error from the test gradient pulses will produce a shift of the phases for both excitation stages, but the directions of the two shifts is the same, and accordingly, the vector sum still produces a result of zero net signal. The result will therefore be a blank image, assuming stable RF and gradient fields.

Figure 5:
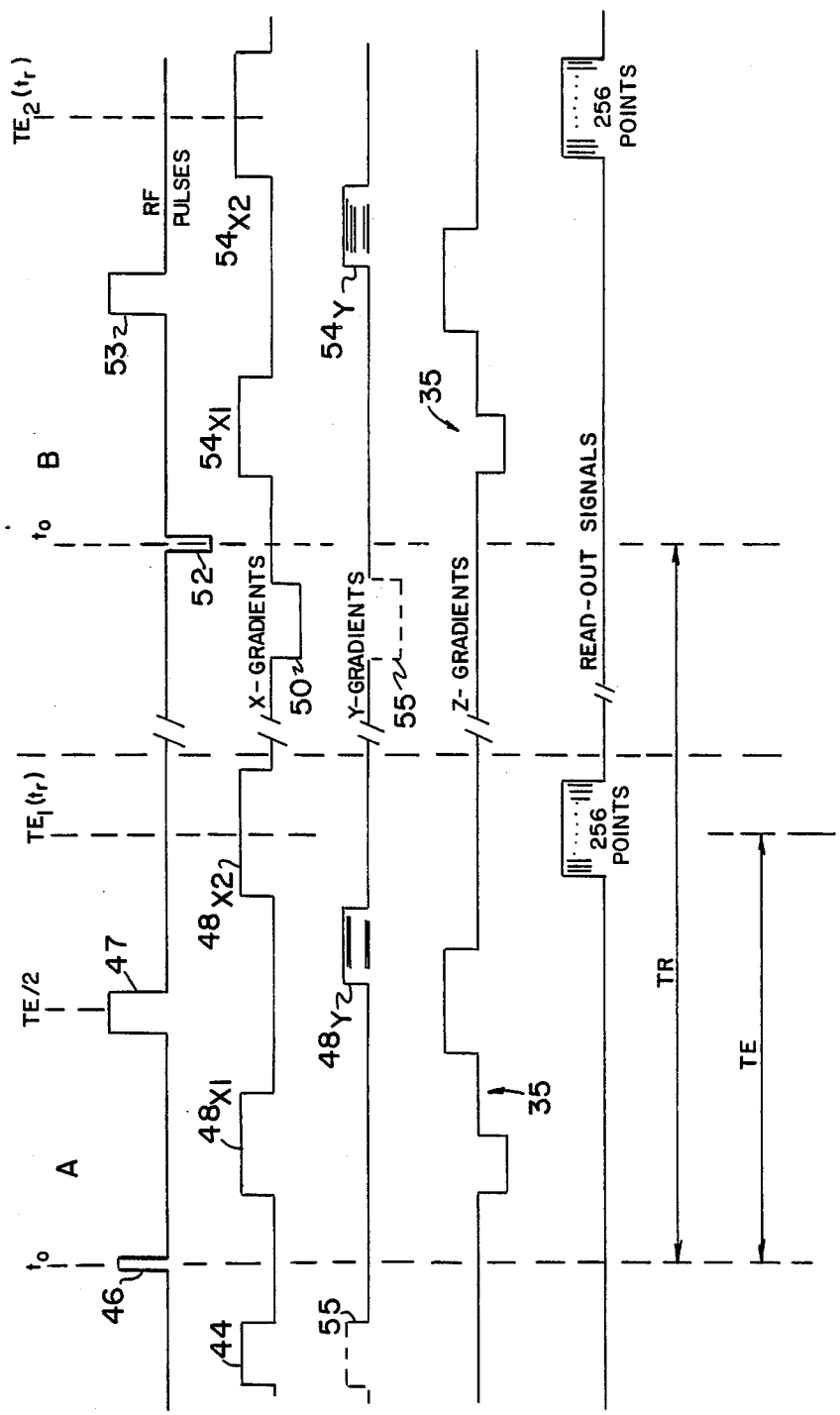
FIG. 5 is a waveform diagram of a gradient and RF pulse sequence applied in accordance with the present invention.

Thus, in accordance with the present invention, in addition to there being oppositely phased RF excitation pulses 46 and 52, there are also opposite polarity test gradients 44 and 50, as shown in FIG. 5. Thus, the residual phase error from the test gradients 44 and 50 has caused a net phase shift, but in opposite directions in the two excitation stages A and B. Accordingly, a positive phase error will be produced in excitation stage A and a negative phase error in excitation stage B. The net vector sum signal of the detected signals at times $TE_1$ and $TE_2$ will be non-zero because of incomplete cancellation of the vectors, as shown in FIG. 9.

Various points must be made about this latter sequence. First, the output signal will reach a maximum when the phase shift in each excitation stage is 90°. The output signal will then decline toward zero at an output signal having a phase of 180° and oscillate through 360°, and the magnitude of the output signal will continue to go through minimum and maximum values for every 90° of error phase shift. There is thus a non-linear relationship between the amount of residual field error and the output signal obtained by the present invention. Secondly, the phase of the output signal only has two values and will shift suddenly between the two values every 180° of error induced phase shift, that is, at every zero point of the magnitude signal. The signal at a given point in the raw eddy current sensitive magnitude image is given by the following equation:

$$S_e = \left| 2S_0 \sin \left[ 2\pi\gamma \int_{t_o}^{t_r} \Delta B_0(t) dt \right] \right|, \qquad (2)$$

where $B_o$ is the local eddy current induced variation of the field from reference, $S_o$ is the magnitude of a normal MRI excitation sequence, $\gamma$ is the gyro magnetic ratio, $t_o$ is the time of the end of the RF excitation pulse at the beginning of time period TE and $t_r$ is the center of the read-out signal at the end of time period TE. The key feature of equation (2) is that the output signal varies as the sine of the time integral of the field error. In addition, it is to be noted that the output signal is scaled by the overall amount of signal available at any point. The fact that the image is a magnitude image is represented by the absolute sign bars at the beginning and end of equation (2).

The output MRI signal at any point for a normal MRI sequence is given by the following equation:

$$S_n = |2S_0| \qquad (3).$$

Equation (3) shows that a normal sequence, that is, an identical sequence without the test gradients 44 and 50 and without the oscillated excitation pulse 52, will produce twice the underlying MR signal if two stages are added.

In accordance with the present invention, if equation (2) is divided by equation (3), that is, the signal produced by the eddy sensitive sequence is divided by the signal from a normal two stage sequence, the term $S_o$ is eliminated and the following equation is produced:

$$S_e/S_n = |\sin [2\pi\gamma \int \Delta B_0(t)dt]| \qquad (4).$$

Equation (4) means that the results are sensitive only to $B_0(t)$, which is the eddy induced field error.

By taking the arcsine of both sides of equation (4), this equation can be rewritten as follows:

$$\int_{t_o}^{t_r} \Delta B_0(t)dt = 2\pi\gamma \sin^{-1}[S_e/S_n]. \qquad (5)$$

Thus, equation (5) is the interal of the phase error, and can be used if the phase error is less than 90°. If the phase error is greater than 90°, then a multiple of $2\pi$ must be added to equation (5) to produce the following equation:

$$\int_{t_o}^{t_r} \Delta B_0(t)dt = 2\pi\gamma \sin^{-1}[S_e/S_n] \pm 2n\pi. \qquad (6)$$

Equations (5) and (6) give the road map needed to generate a true eddy induced field error map.

The above discussion has been concerned with image acquisition, which concerns the principles of physics used, the pulse sequence used to implement such principles, the interpretation of the resulting data, and the equations that describe the resulting data.

However, it is still necessary to discuss image processing, that is, how to take the data in its raw form and convert it to a true eddy current field map, as will now be described.

Basically, three images are required as the raw material for this part of the present invention. First, a magnitude image produced by a normal two average spin echo sequence is needed to provide normalization. Such an image is shown in the photograph of FIG. 10. This image corresponds to the raw data obtained with respect to equation (3). Specifically, this image was obtained with the sequence of FIG. 4 in which there are no test gradient pulses and the 90° RF pulses are all positively phased. The image of FIG. 10 was created from a circular phantom of 20 cm diameter centered in the body coil. It is noted that the signal intensity drops off slightly at the edges because of RF inhomogeneity.

The second required image is the magnitude reconstruction of the output of the eddy sensitive pulse sequence, as shown by the photograph of FIG. 11. This image corresponds to the raw data obtained with respect to equation (2).

The third image i the phase image from the same set of data used in FIG. 11, and is shown by the photograph of FIG. 12. In other words, image intensity at any point is directly related to the phase at that point. It will be noted that the image undergoes sudden transitions in phase at regular intervals in the x-direction, that is, between light and dark. This occurs whenever the signal in the magnitude image goes to zero.

One line of data from each of the three images of FIGS. 10–12 is shown in FIGS. 13A—13C, respectively. Specifically, 256 points of data are obtained. Various points will be noticed with respect to these Figures. First, the general outline of the raw eddy-sensitive magnitude image is the same as the general shape of the normalization magnitude image. Secondly, there is noise outside of the range of the images obtained, and third, the eddy-sensitive phase image undergoes a transition each time that the eddy-sensitive magnitude image goes to zero.

The three images of FIGS. 10–12, namely the normalization magnitude image, the eddy-sensitive magnitude image and the eddy-sensitive phase image, respectively, are used as the raw material in the image processing steps needed to extract a true map of eddy current induced field errors according to the present invention.

In order to do so, the following six steps are followed:
(1) noise offset compensation,
(2) image thresholding,
(3) normalization,
(4) arcsine generation,
(5) sign regeneration, and
(6) phase unwrapping.

As shown above in FIG. 13A with respect to the eddy-sensitive magnitude image, there is noise present. The noise shown on the image is the absolute value of the true noise, because of equation (2). Accordingly, instead of the noise averaging to zero, the average noise is a positive number and represents an offset for the entire image. Therefore, in accordance with the first step, it is necessary to compensate for this noise by measuring the average value of the noise and subtracting this value as an offset from each pixel in the image.

Figures 14A, 14B:
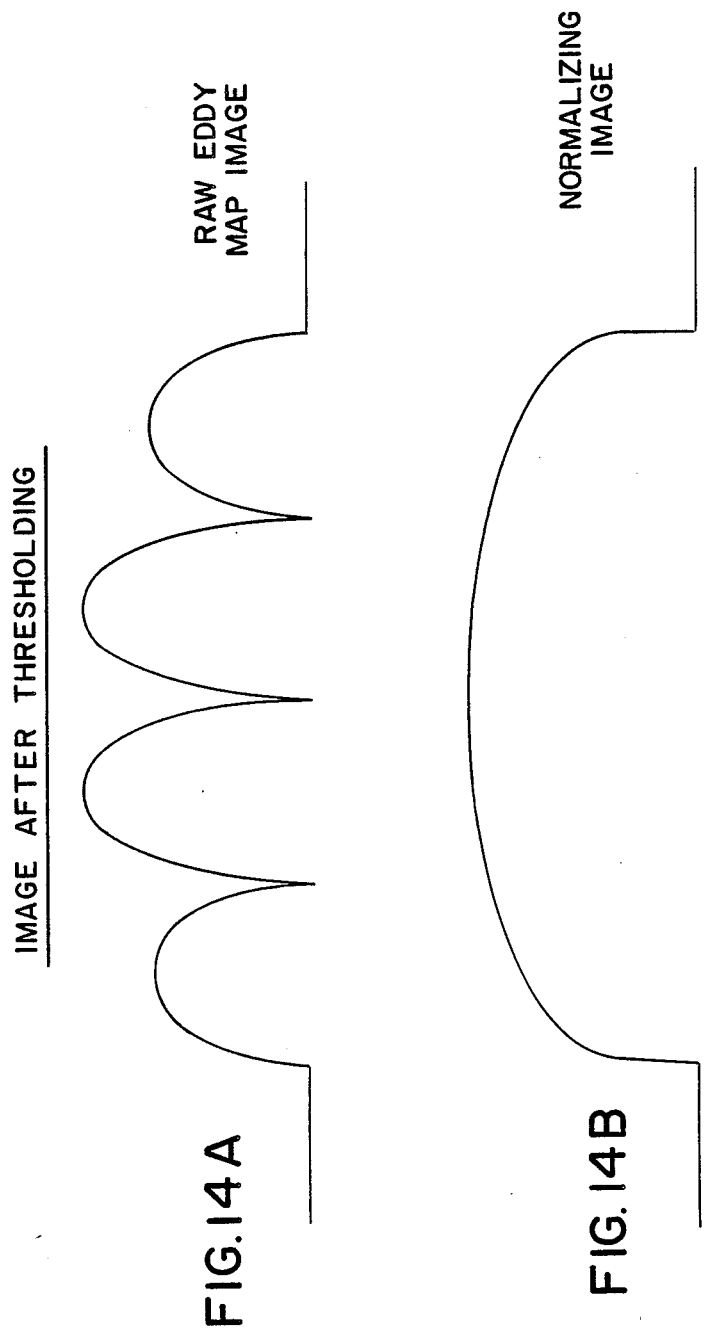
FIG. 14A is the waveform diagram of FIG. 13A after a threshold value has been assigned thereto.
FIG. 14B is the waveform diagram of FIG. 13B after a threshold value has been assigned thereto.

Because the remaining steps require a signal of sufficient strength for proper processing, in the second step, a threshold value is assigned which is necessary for processing and any value of the image less than this threshold value is set to zero, for the eddy-sensitive magnitude image and the normalization magnitude image, as shown in FIGS. 14A and 14B. It will be appreciated that, in FIGS. 14A and 14B, all background noise has been eliminated.

Since the signal in the eddy-sensitive magnitude image is fundamentally an MRI signal, it is sensitive to the same physical parameter as a normal MRI image, such as tip angles, slice thickness, TE, TR and RF homogeneity. However, in order to derive an eddy current map, these parameters are of no interest. Accordingly, the effects of these parameters are removed by dividing the eddy-sensitive magnitude image of FIG. 14A by the normalization magnitude image of FIG. 14B to produce the normalized eddy-sensitive magnitude image of FIG. 15 which has a maximum value of one, and in which the tops of the peaks are all of equal height.

Figure 15:
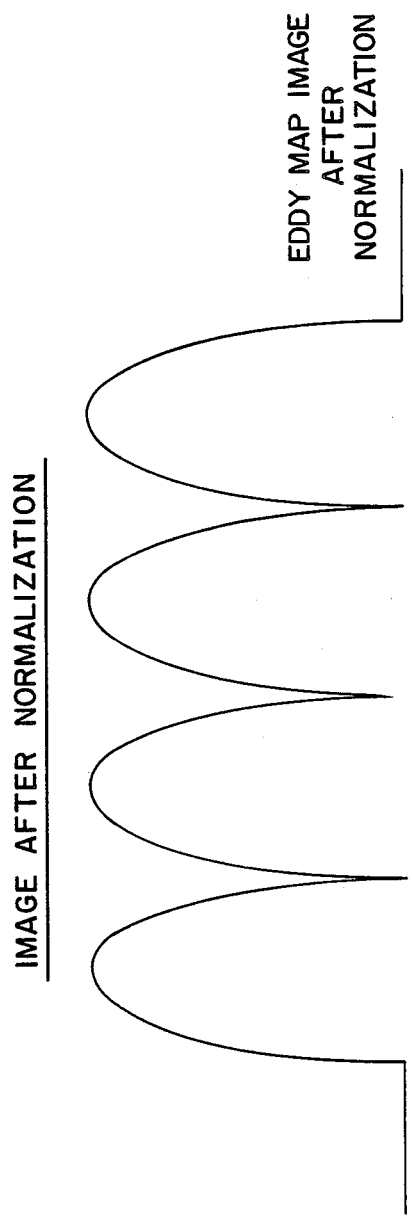
FIG. 15 is the waveform diagram of FIG. 14A after being normalized.
Figure 16:
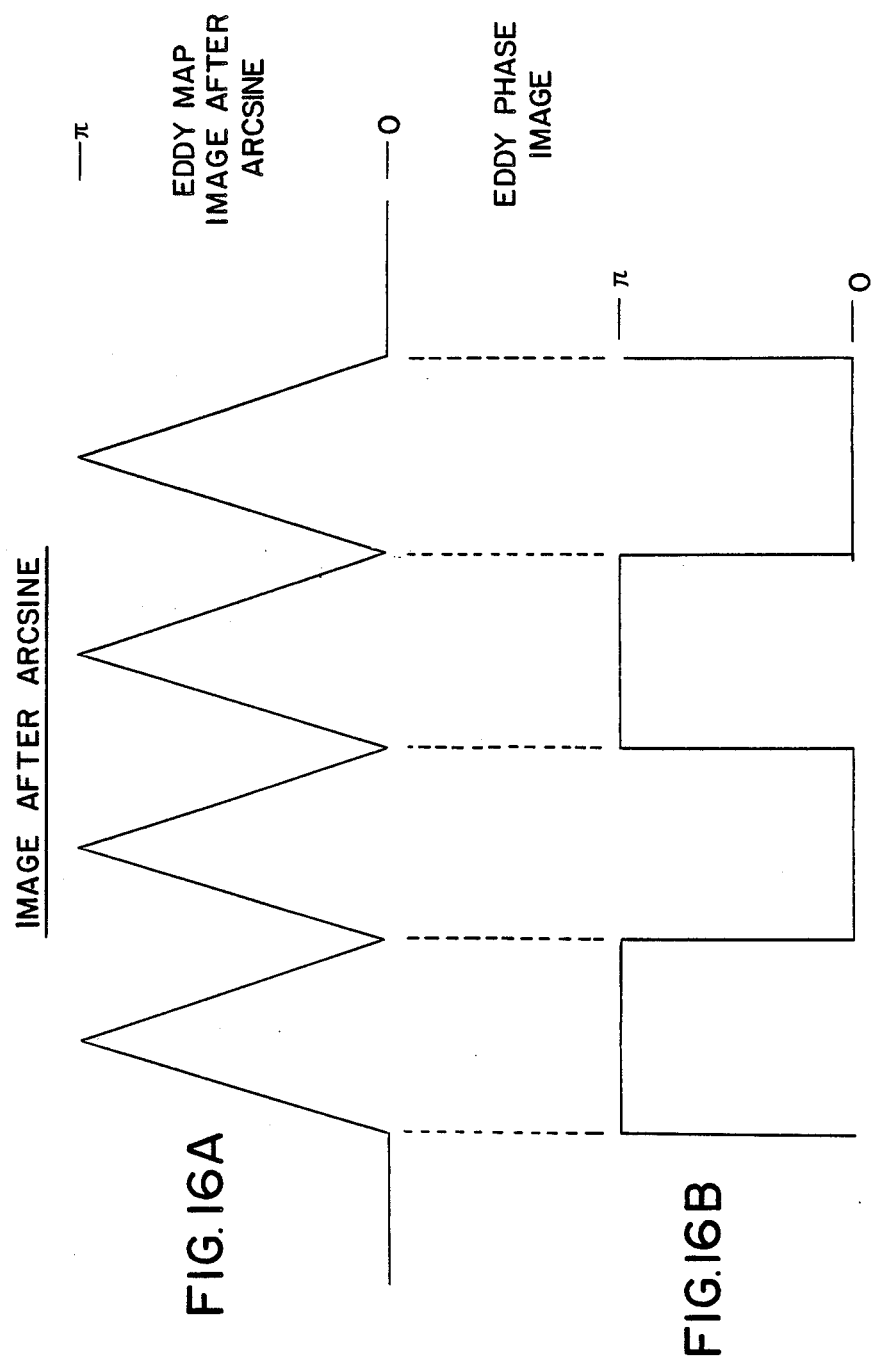
FIG. 16A is the waveform diagram of FIG. 15 after arcsine generation.
FIG. 16B is the waveform diagram of FIG. 13C repeated.

In the fourth step of arcsine generation, the sine component of the eddy-sensitive magnitude image of FIG. 15 was removed by taking the arcsine of every pixel value, in order to arrive at the image of FIG. 16A. This is in conformance with equations (5) and (6) above. The eddy-sensitive phase image of FIG. 13C is recreated as FIG. 16B below the image of FIG. 16A, and the transition points of the eddy-sensitive phase image of FIG. 16B are used to precisely define the zero points of the modified eddy-sensitive magnitude image of FIG. 16A. It will be appreciated that the image of FIG. 16A is bounded between magnitude values of 0 and $\pi$. However, the value $\pi$ is only reached if the magnitude of the original eddy-induced phase error is greater than or equal to 90°.

It will be appreciated that, in the eddy-sensitive magnitude image of FIG. 16A, wherever the original eddy-sensitive magnitude image would have been negative, the eddy-sensitive magnitude image of FIG. 16A will be positive. Accordingly, it is necessary to regenerate the sign for these ares of the image of FIG. 16A, in step (5). Specifically, an arbitrary point is defined as a reference point and the sign of the reference point is defined as positive. Then, as the different pixels are examined, it will be found that pixels farther from the reference point have values which may approach zero. If the value of a pixel is sufficiently close to zero, it is assumed that a sign change has occurred and that all future points are negative until their values again approach zero. In other words, every time the value of the output goes to zero, the sign is inverted, so as to produce the sign regenerated eddy-sensitive magnitude image of FIG. 17A.

Figure 17:
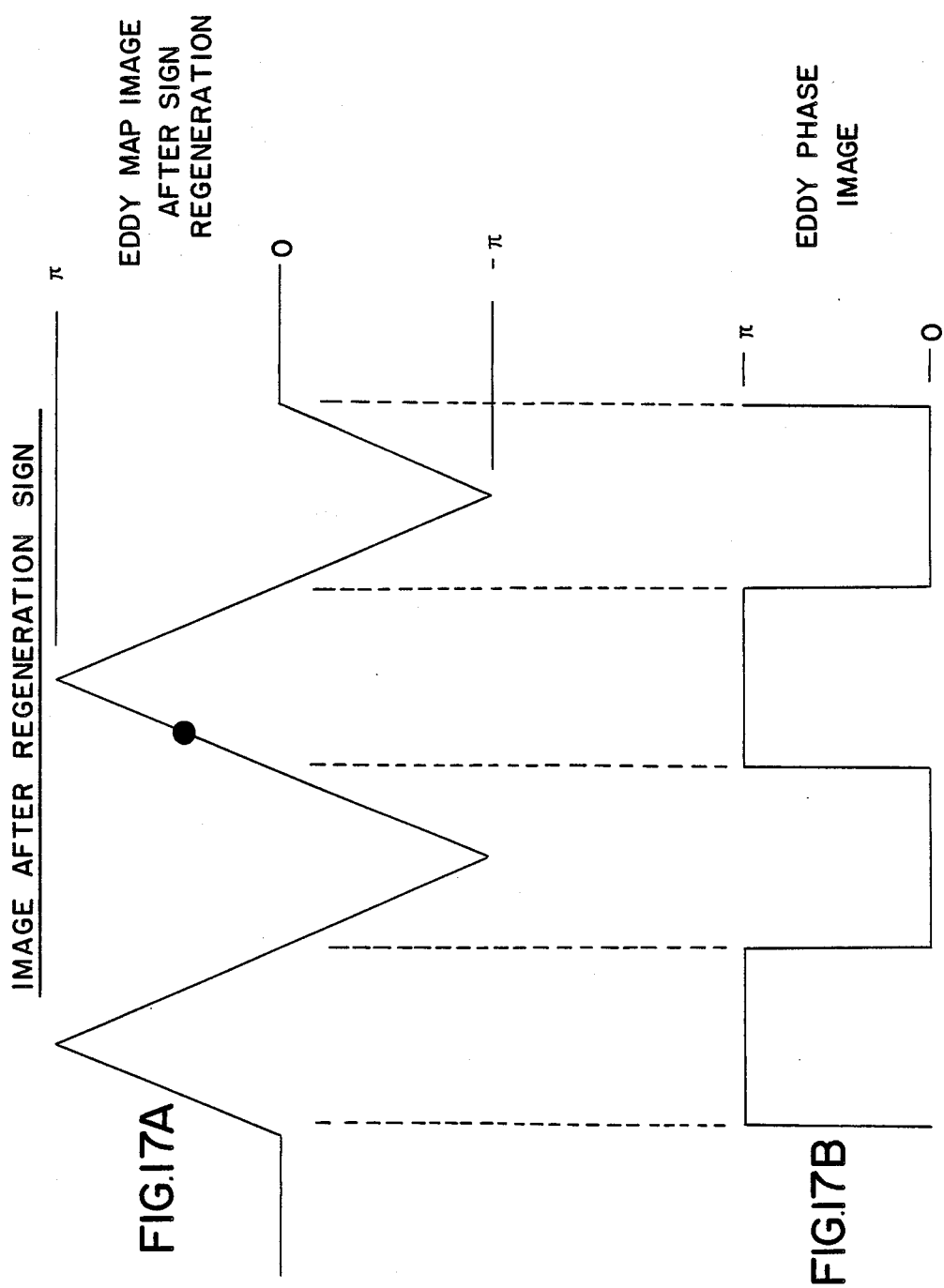
FIG. 17A is the waveform diagram of FIG. 16A after sign regeneration.
FIG. 17B is the waveform diagram of FIG. 13C repeated.

Unfortunately, the presence of noise makes this exact transition somewhat uncertain. However, because the phase shifts suddenly by 180° at each zero point, the eddy-sensitive phase image of FIG. 13C (reproduced as FIG. 17B) can be use to more precisely determine the zero points. However, even the eddy-sensitive phase image of FIG. 17B is subject to some noise. Therefore, at least three points are checked to insure a proper transition detection.

In this regard, if the phase is near 0° or 360°, small shifts in actual phase can cause large apparent (360°) shifts in phase. This must be taken into account to avoid erroneous results. Thus, the sign regeneration occurs independently for each line along the x-axis (assuming an x-axis test gradient). The reference pixel is chosen to be ten pixels to the right of center. It is reasonable to assume that this pixel is positive because the predominate linear component would have the same sign characteristics as the originating gradient pulse. Thereafter, each pixel is examined in order on opposite sides thereof.

After the sign is regenerated in step (5) above, the image must be unwrapped in step (6). In this regard, the single, continuous straight line of FIG. 18 is produced.

Specifically, the sine nature of the eddy-sensitive pulse sequence of FIG. 5 means that the magnitude of the image of FIG. 17A is bounded by $\pm \pi$. However, the underlying phase error might have values greater than these boundaries. Thus, when the signal is increasing with position, it can increase to a maximum of $\pi$ and then will decrease. After a maximum the raw image value will be x, but the true value of phase should be $2\pi - x$. At each $n\pi$ radians of additional eddy induced phase error, the image signal passes through additional maximum and minimum values. Each such maximum or minimum value must be detected and the pixel value appropriately adjusted.

The step of phase unwrapping is accomplished by starting at an off-center, arbitrarily chosen, reference point. The state of the next point depends on the state of the current point. For example, if the numbers are rising, a state transition will occur when the value exceeds a threshold set slightly below the maximum $\pi$ value. At least two points with values above this threshold must occur before the state change occurs. The next state change occurs when the value drops below the threshold. In this new state, the output value is $n\pi$ plus or minus the input value, and n is incremented by one each time this state is entered. Thus, as the points get further away from the reference point, if their value goes to $\pm \pi$, the image must be unwrapped.

Figure 18:
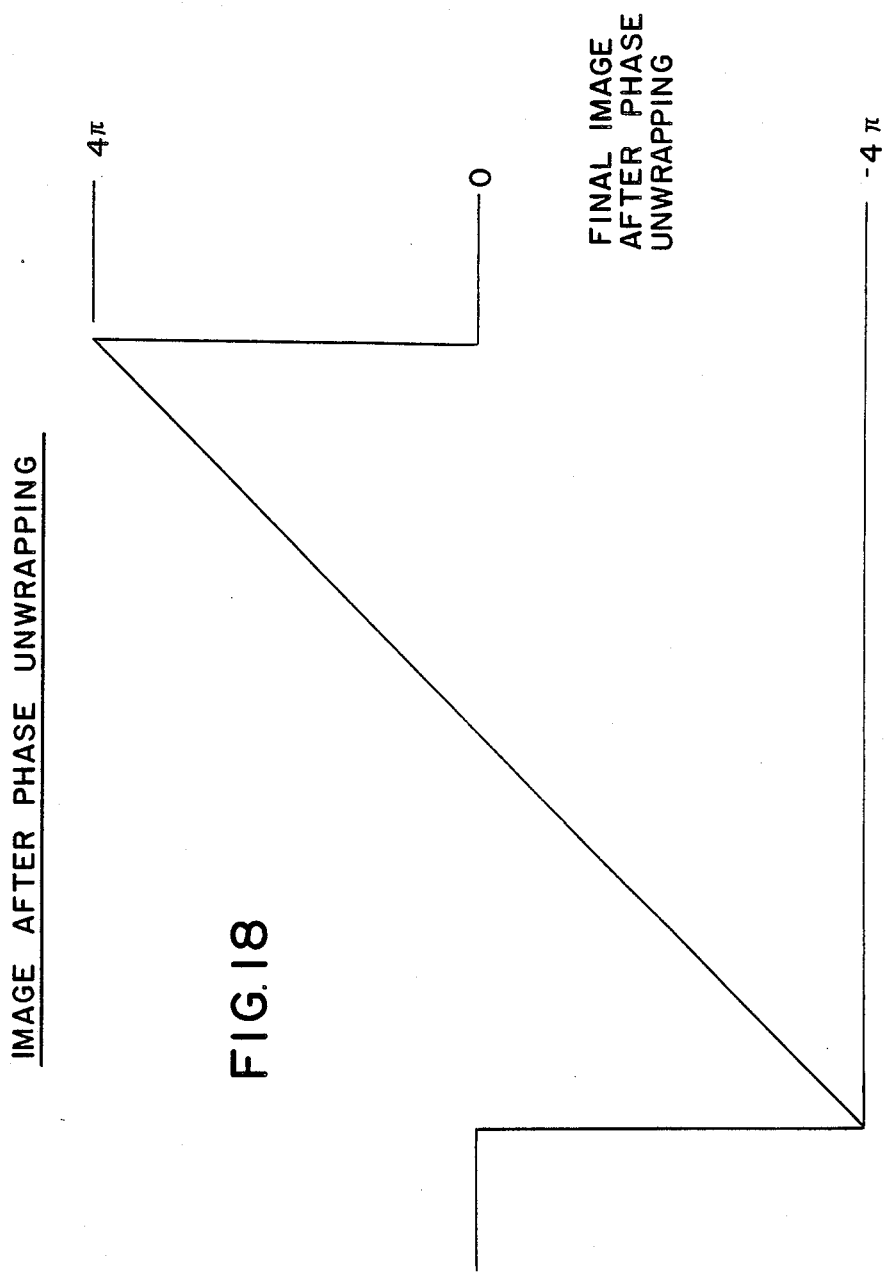
FIG. 18 is the waveform diagram of FIG. 17A after unwrapping of the same, which is a map of the time integral eddy induced field error.

The resulting image of FIG. 18 is therefore a map of one line of the time integral eddy induced field error expressed in terms of radians of rotation of phase. This map varies slowly with position. The varying y-gradients result in a total map, for example, for 128 lines. Therefore, it is difficult to display it as a normal gray-scale image to qualitatively view the effects of eddy current,, although this can be done as shown by the field error image in the photograph of FIG. 19 in which it is seen that the field error varies linearly across the image.

However, it is better to present the data with a color map in which hue varies with phase angle, as shown in FIG. 20. Thus, small variations of hue are easily discernible.

Figure 21:
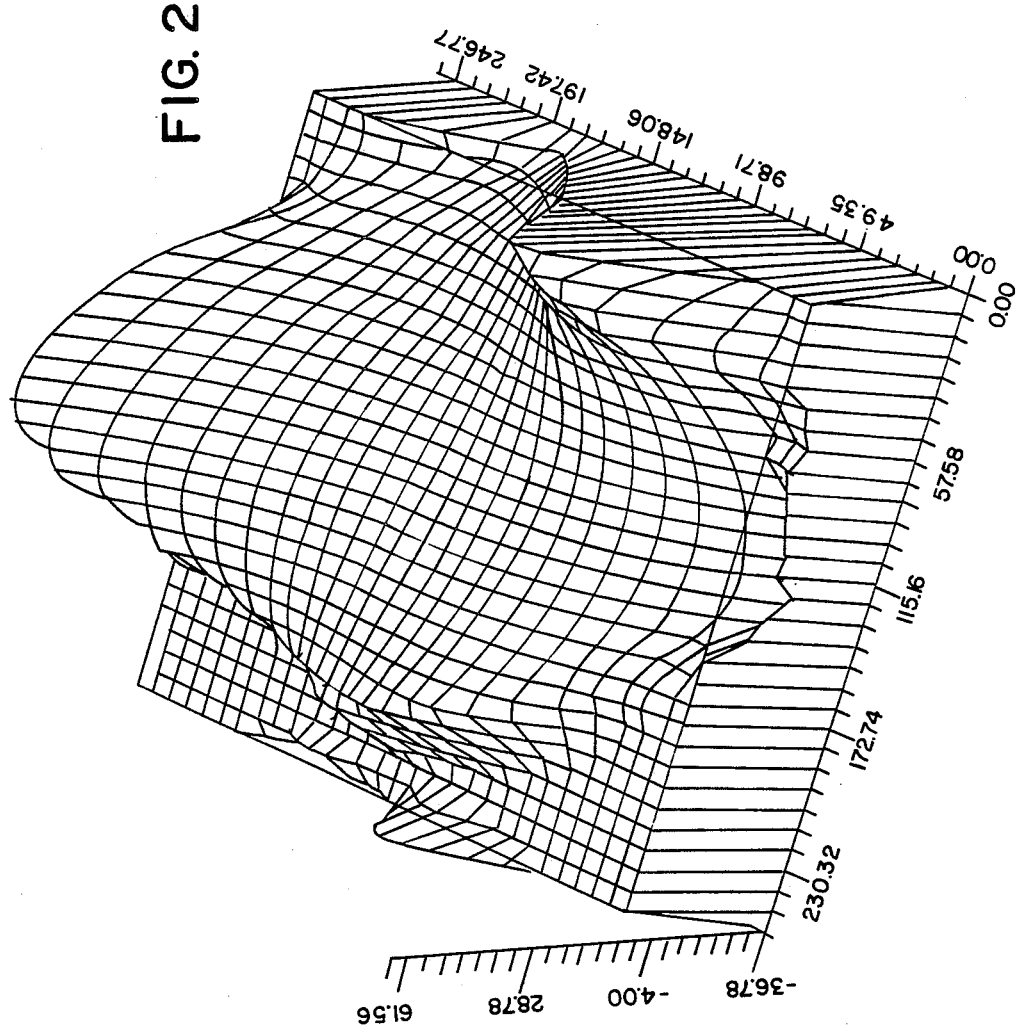
FIG. 21, is a three-dimensional plot of the time integral eddy induced field error map of FIG. 18.

It is also possible to present the eddy current map as a three-dimensional plot in which height corresponds to the local pixel value and the x and y points are along a plane rotated obliquely to the viewing plane, as shown in FIG. 21. This method, as with the color map of FIG. 20, enables the identification of small local variations in the field.

A final form of presentation can be a topological map where lines are drawn along points of constant phase. This would give good visualization of areas of rapidly changing field, but would not permit easy visualization of a positive versus negative field error.

The aforementioned images were produced with the eddy-sensitive pulse sequence of FIG. 5 on a Technicare 0.6 t MRI system. The test phantom was a 20 cm sphere filled with a $1\times 10^4$ M solution of $MnCl_2$. The TE of the sequence was adjusted to 40 msec and the TR to 1 second. The slice selection gradient (on during the 180° RF pulse) was adjusted to produce a slice thickness of 1 cm. The slice was obtained in a sagittal orientation. The test gradient was along the frequency encoding axis and was parallel to the main magnetic field. It was adjusted to have a duration of 50 msec and the magnitude thereof was set at 0.1 g/cm ($\frac{1}{4}$ of the maximum field strength).

A total of eight test images were obtained with a different delay between the end of the test gradient and the center of the 90° RF pulse. The values used for this delay were 1.0, 1.7, 1.8, 1.9, 2., 2.1, 10.0, 30.0 and 50 msec, respectively. A single normalization image was obtained with the gradient and the 90° RF pulse not alternated and a separation delay of 1 msec. Two averages were obtained and the y-resolution was set to 64. Thus, the total acquisition time per image was two minutes.

A computer program for use in computer 16 for performing the above steps (1) to (6) above is as follows:

```
C PROGRAM EDDY9
C
C This program will take three image files and convert to a eddy magnetic field
C map.
C
C EDDY8 Modify to start phase wrap search in center of picture
C EDDY9 Create from eddy8 and modify to do magnitude unwrapping 4/28/88
C
    BYTE IIB1(0:511), IIB2(0:511)
    BYTE IIB3(0:511), IIB4(0:511)
    CHARACTER*40 INFILE
    INTEGER*2 DATBUF(256),DATBU1(256),DATBU2(256)
    INTEGER*2 K0,K1,K2,K3,K4,K5,K6,K7,K8,FLPFLG
    INTEGER*2 FLAG,FLG1,FLG2,NOISFL,LINE,MIINFL,OLINE
    INTEGER*2 NOISEM,NOISEP,SPLIT,NOISOF
    REAL*4 RMIN,RMAX,MITMP1,MITMP2
    REAL*4 MI,PI,P1,P2,OFFSET,MIOLD,MIDEL
    REAL*4 MIMAGE(256,16),MINI(16),MAXI(16)
    REAL*4 MSCAL1,MSCAL2,MSCAL3,MIZER1,MIZER2,MIZER3
    REAL*4 MEAN,IZER,SCL1,CORR,MRMAX,SCAL
    REAL*4 EPS1,EPS,OPSUM,THRESH,THRESL
    INCLUDE 'IIB1F7DF.FTN'
    INCLUDE 'NIIB2F7DF.FTN'
```

```
      TWOPI=6.2831853
C
C OPEN INPUT FILE
C

TYPE *,' Do you want debug mode? (0=n, 1=y, def=no) '
      READ (*,975)NC,LINE
      IF(NC.EQ.0) LINE=0
      TYPE *,' Enter row at which to split (def=135): '
      READ (*,975)NC,SPLIT
      IF(NC.EQ.0) SPLIT=135
      TYPE *,' Enter offset to add to noise (def=0): '
      READ (*,975)NC,NOISOF
      IF(NC.EQ.0) NOISOF=0
975   FORMAT(Q,I3)
      IF (LINE.EQ.0) THEN
        TYPE *,' Enter line to output (def=none): '
        READ (*,975)NC,OLINE
        IF(NC.EQ.0) OLINE=300
      ENDIF
      IF (LINE.NE.1.AND.OLINE.EQ.300) THEN
800   TYPE *,' ENTER NAME OF THE MAPPING .IDF FILE '
      READ (*,969)NC,INFILE
      IF(NC.EQ.0) GOTO 800
      OPEN(UNIT=4,NAME=INFILE,TYPE='OLD',ACCESS='DIRECT',RECL=126,READONLY)
802   TYPE *,' ENTER NAME OF THE NORMALIZING .IDF FILE '
      READ (*,969)NC,INFILE
      IF(NC.EQ.0) GOTO 802
      OPEN(UNIT=2,NAME=INFILE,TYPE='OLD',ACCESS='DIRECT',RECL=128,READONLY)
804   TYPE *,' ENTER NAME OF THE PHASE   .IDF FILE '
      READ (*,969)NC,INFILE
      IF(NC.EQ.0) GOTO 804
      OPEN(UNIT=7,NAME=INFILE,TYPE='OLD',ACCESS='DIRECT',RECL=128,READONLY)
801   TYPE *,' ENTER NAME OF THE OUTPUT  .IDF FILE'
      READ (*,969)NC,INFILE
      IF(NC.EQ.0) GOTO 801
969   FORMAT(Q,A)
      OPEN(UNIT=3,NAME=INFILE,TYPE='NEW',ACCESS='DIRECT',RECL=128,
     1    INITIALSIZE=260)
      ELSE
      OPEN(UNIT=4,NAME='2339.IDF',TYPE='OLD',ACCESS='DIRECT',
     1    RECL=126,READONLY)
      OPEN(UNIT=2,NAME='2336.IDF',TYPE='OLD',ACCESS='DIRECT',
     1    RECL=128,READONLY)
      OPEN(UNIT=7,NAME='2348.IDF',TYPE='OLD',ACCESS='DIRECT',
     1    RECL=128,READONLY)
      OPEN(UNIT=3,NAME='FU.IDF',TYPE='NEW',ACCESS='DIRECT',
     1    RECL=128,INITIALSIZE=260)
      ENDIF THRESL=TWOPI*1000.0/2.0 * 0.6
      THRESH=TWOPI*1000.0 * 0.8
C
C READ HEADER OF NORMALIZING FILE
C
      READ(2'2) IIB2
C
C GET SCALING
C
      MSCAL2 = I2SCAL
      MIZER2 = I2IZER
C
C
```

```
C READ HEADER OF PEASE FILE
C
  READ(7'2) IIB2
C
C GET SCALING
C
  MSCAL3 = I2SCAL
  MIZER3 = I2IZER
C
C READ HEADER OF FILE 1
C
  READ(4'1) IIB1
  READ(4'2) IIB2
  READ(4'3) IIB3
  READ(4'4) IIB4
C
C GET SCALING
C
  MSCAL1 = I2SCAL
  MIZER1 = I2IZER
  MRMAX  = I2MAXV
C
C READ IN THE IMAGE, convert to floating, and process
C
  IF (LINE.EQ.1) THEN
    K6=8
    K7=8
  ELSE
    K6=1
    K7=16
  ENDIF
  DO 812 K2=K6,K7

C This is the data manipulation section
  RMIN = 0.0
  RMAX = 0.0

DO 2041 K1=K6,K7

KB=16*(K2-1)+K1+4
    TYPE *,'BLOCK #',KB

READ(4'KB) (DATBUF(K0),K0=1,256)
    READ(2'KB) (DATBU1(K0),K0=1,256)
    READ(7'KB) (DATBU2(K0),K0=1,256)

IF (KB.EQ.5) THEN
    TYPE *,DATBUF(1),DATBUF(2),DATBUF(3),DATBUF(4),DATBUF(5),DATBUF(6)
    TYPE *,DATBU1(1),DATBU1(2),DATBU1(3),DATBU1(4),DATBU1(5),DATBU1(6)
    TYPE *,MSCAL1,MSCAL2
    NOISEM=(DATBUF(1)+DATBUF(2)+DATBUF(3)+DATBUF(4)+DATBUF(5)+
   1       DATBUF(6)+DATBUF(7)+DATBUF(8)+DATBUF(9)+DATBUF(10)+
   2       DATBUF(11)+DATBUF(12))/12.+NOISOF
    NOISEP=(DATBU1(1)+DATBU1(2)+DATBU1(3)+DATBU1(4)+DATBU1(5)+
   1       DATBU1(6))/6.
    TYPE *,'NOISEM= ',NOISEM,'  NOISEP= ',NOISEP
  ENDIF

DO 2039 K4=0,1

MIINFL=0
    MIOLD=0.0
    FLPFLG=0
```

```
      OFFSET=0.0
      K5=1
      IF (K4.EQ.1) K5=-1
      FLG2=0
      FLG1=0
      FLAG=1
      NOISFL=0
      OPSUM = 0.0
C     P1=FLOAT(DATBU2(135+K4))/MSCAL3 + MIZER3
      P1=FLOAT(DATBU2(SPLIT-1+K4))/MSCAL3 + MIZER3

C DO 2040 K0=136-K4,253-(K4*250),K5
  DO 2040 K0=SPLIT-K4,253-(K4*250),K5
      PI=FLOAT(DATBU1(K0)-NOISEP)/MSCAL2 + MIZER2
      IF (PI.LT.5.0) GOTO 1234
      P2=FLOAT(DATBU2(K0+3*K5))/MSCAL3 + MIZER3
      MI=FLOAT(DATBUF(K0)-NOISEM)/MSCAL1 + MIZER1
      MITMP2=FLOAT(DATBUF(K0))/MSCAL1 + MIZER1
      MI=MI/PI
      IF (MI.GT.1.1.or.MI.LT.0.0) MI=0.0
      IF (MI.GT.1.0) MI=1.0
      MI=ASIN(MI)
C
C This is phase unwrapping section
C
  EPS1=ABS(P1-P2)
  IF (EPS1.LE.500.OR.EPS1.GE.5900) THEN
     IF (NOISFL.EQ.0) THEN     !
        IF (FLG1.NE.2) THEN    !
           FLG1=FLG1+1   !
        ELSE   ! -> in noise region
           OPSUM=(P2+P1)/2.   !
           NOISFL=1   !
           FLG1=0   !
        ENDIF   !

ELSE
        EPS=ABS(P2-OPSUM)   !
        IF (EPS.GT.THRESH) THEN   !
           FLG1=FLG1+1   !
           IF (FLG1.EQ.2) THEN   ! -> 360o wrap
  FLG1=0   !
  OPSUM=(P2+P1)/2.   !
        ENDIF   !
        FLG2=0   !

ELSEIF (EPS.GT.THRESL) THEN
        FLG2=FLG2+1   !
        IF (FLG2.EQ.3) THEN   !
           FLG2=0   !
           OPSUM=(P1+P2)/2.0   !
           IF (FLAG.EQ.1) THEN   ! -> 180o border
              FLAG=-1   !
           ELSE   !
              FLAG=1   !
           ENDIF   !
        ENDIF   !
        FLG1=0   !

ELSE
C        OPSUM=0.7*(OPSUM) + 0.15*(P1+P2)   !
        flg1=0   ! -> no change
        flg2=0   !
```

```
        ENDIF    !
      ENDIF

ELSE
    flg1=0
    flg2=0
  ENDIF

P1=P2
  MI=MI*FLAG
  IF (KB.EQ.OLINE) TYPE *,K0,' eps1=',EPS1
  1    ,' eps=',EPS,' noisfl=',NOISFL,' FLAG=',FLAG
  IF (KB.EQ.OLINE) TYPE *,'     FLG1= ',FLG1,' FLG2= ',FLG2,
  1       ' OPSUM= ',OPSUM,' P2=',P2

C *******
C  This is the SINE unwrapping section
C *******

MIDEL=MI-MIOLD
  MIOLD=MI
   IF (MIINFL.EQ.4) THEN    ! Rising
     MI=MI+OFFSET
     IF (MIOLD.GT.1.3) MIINFL=5
   ELSE IF (MIINFL.EQ.5) THEN  ! High transition zone
     IF (MIDEL.LT.0.0) THEN
       MIINFL=6
       OFFSET=OFFSET+3.1415
       MI=OFFSET-MI
     ELSE
       MI=MI+OFFSET
     ENDIF
   ELSE IF (MIINFL.EQ.6) THEN  ! Falling
     MI=OFFSET-MI
     IF (MIOLD.LT.-1.3) MIINFL=7
   ELSE IF (MIINFL.EQ.7) THEN  ! Lower transition zone
     IF (MIDEL.GT.0.0) THEN
       MIINFL=4
       OFFSET=OFFSET+3.1415
       MI=MI+OFFSET
     ELSE
       MI=OFFSET-MI
     ENDIF ELSE IF (MIINFL.EQ.-4) THEN  ! Falling
     MI=MI+OFFSET
     IF (MIOLD.LT.-1.3) MIINFL=-5
   ELSE IF (MIINFL.EQ.-5) THEN  ! Lower transition zone
     IF (MIDEL.GT.0.0) THEN
       MIINFL=-6
       OFFSET=OFFSET-3.1415
       MI=OFFSET-MI
     ELSE
       MI=MI+OFFSET
     ENDIF
   ELSE IF (MIINFL.EQ.-6) THEN  ! Rising
     MI=OFFSET-MI
     IF (MIOLD.GT.1.3) MIINFL=-7
   ELSE IF (MIINFL.EQ.-7) THEN  ! Upper transition zone
     IF (MIDEL.LT.0.0) THEN
       MIINFL=-4
       OFFSET=OFFSET-3.1415
       MI=MI+OFFSET
```

```
    ELSE
      MI=OFFSET-MI
    ENDIF
  ELSE      ! DETERMINE DIRECTION
    MIINFL=MIINFL+1
    IF (MIDEL.LT.0.0) MIINFL=MIINFL-2
  ENDIF
c IF (LINE.EQ.1) TYPE *,K0,' FL=',MIINFL,' MI=',MI
c    1      ,' OF=',OFFSET,' MIO=',MIOLD
c IF (KB.EQ.OLINE) TYPE *,K0,' FL=',MIINFL,' MI=',MI
c    1      ,' OF=',OFFSET,' MIO=',MIOLD

C *******
C   This section calculates the max in a 16 line block
C *******
  DO 2028 K2=1,16
  SCL1=MAX(MAXI(K2),ABS(MINI(K2)))/MAX(RMAX,ABS(RMIN))
  TYPE *,'SCALE BLOCK #',K2

DO 825 K1=1,16
  KB=16*(K2-1)+K1+4
  READ(3'KB) (DATBUF(K0),K0=1,256)
  DO 820 K0=1,256
  DATBUF(K0)=DATBUF(K0) * SCL1
820 CONTINUE
  WRITE(3'KB) (DATBUF(K0),K0=1,256)
825 CONTINUE

2028 CONTINUE

SCAL = 32700./(RMAX)
  I2SCAL = SCAL
  I2MINV = RMIN
  I2MAXV = RMAX
  I2I2ER = 0.0

TYPE *,'WRITE OUT IIB'
  WRITE(3'1) IIB1
  WRITE(3'2) IIB2
  WRITE(3'3) IIB3
  WRITE(3'4) IIB4
C
C WRITE OUT
C

CLOSE(UNIT=3)

GOTO 5000
4025 WRITE(*,4030)
4030 FORMAT(/,' SCALING ERROR ')
5000 END
  IF(MI.LT.RMIN) RMIN = MI
  IF(MI.GT.RMAX) RMAX = MI
  GOTO 1235
1234 MI=0.0
c 1235 IF (LINE.EQ.1) TYPE *,'K0=',K0,' P2=',P2,'PI=',P1,'MI=',MI
1235 MIMAGE(K0,K1)=MI

2040 CONTINUE

2039 CONTINUE
```

```
MIMAGE(1,K1)=0.0
MIMAGE(2,K1)=0.0
MIMAGE(3,K1)=0.0
MIMAGE(254,K1)=0.0
MIMAGE(255,K1)=0.0
MIMAGE(256,K1)=0.0

2041 CONTINUE

C  Find new scale factor
C
 IF (RMAX.EQ.0.0) RMAX=0.00001
 MINI(K2)=RMIN
 MAXI(K2)=RMAX
 SCAL = 32700./MAX(RMAX,ABS(RMIN))

DO 2026 K1=1,16
 KB=16*(K2-1)+K1+4
 DO 2025 K0=1,256
2025 DATBUF(K0)=IFIX(MIMAGE(K0,K1)*SCAL)
C 2025 IF (K2.EQ.2) TYPE *,K0,' SC=',SCAL,' MI=',MIMAGE(K0,K1),
C   1 DATBUF(K0)
 WRITE(3'KB) (DATBUF(K0),K0=1,256)
2026 CONTINUE

812 CONTINUE

CLOSE(UNIT=2)
 CLOSE(UNIT=4)
 CLOSE(UNIT=7)

RMIN=0.0
 RMAX=0.0

TYPE *,'Calculate global max and min'
 DO 2027 K2=1,16
 IF(MINI(K2).LT.RMIN) RMIN = MINI(K2)
 IF(MAXI(K2).GT.RMAX) RMAX = MAXI(K2)
 TYPE *,MINI(K2),MAXI(K2),MINI(K2),MAXI(K2)
2027 CONTINUE
 TYPE *,RMIN,RMAX

IF(RMAX.EQ.0.0) GOTO 4025
```

With the above procedure, including the generation of the normalization image, the data needed for any eddy induced field error map could be obtained in four minutes, which greatly reduces the down time of MRI apparatus 10, from the approximately eight hours in the prior art.

The post acquisition processing was implemented in Fortran on Technicare's PDP 11/84 computer. The three-dimensional formatting of the data was performed on an IBM PS/2 Model 50 computer with color monitor. Post processing took approximately two minutes per image.

With the above, each acquisition of data and post processing produces a total of 128×256 sample points, which is sufficient to fit a two dimensional polynomial equation to the data. Thus, the coefficients of the polynomial would give an accurate mathematical representation of how the field error behaves at any point in time. Such derived polynomial equation has an accuracy which is far greater than any discrete measurements obtained with the aforementioned prior art sense coils, with far greater resolution.

The coefficient of the linear term of the polynomial represents an accurate means to adjust normal eddy current compensation. In fact, if the y-resolution is decreased to one and sixty-four lines of data are acquired, each with a different gradient delay, then sufficient information would be acquired in four minutes to accurately model the behavior of the eddy currents along the x-axis with time. Since current techniques take as long as seven hours per gradient, this would represent a significant improvement in time.

It will therefore be appreciated that the existence of the present method to calculate higher order terms of eddy current field effects, presents the opportunity to control or eliminate these effects in a simple manner. First the mathematical formulation would allow estimation of the location of the eddy surfaces. Secondly, the nature of the eddy induced field could be modified by the addition of a new strategically placed surface which could change, for example, a second order eddy effect to a first order eddy effect which could then be eliminated with appropriate first order eddy current compensation.

It will be appreciated that the above-discussed pulse sequence of FIG. 5 is only a preferred embodiment of the present invention that has been used for explanation. However, the present invention has much greater versatility. In this regard, there are four general criteria that must be satisfied when modifying a normal MR pulse sequence.

First, there must be at least two stages, such as stages A and B discussed in regard to FIG. 5.

Second, there must be at least one magnetic test gradient in the total of all of the stages, with each test gradient occurring prior to the RF excitation pulse in that stage. Thus, for example, it is possible to eliminate test gradient 50 in stage B of FIG. 5. As another example, if there are six stages A–F in the pulse sequence, a test gradient in stage B only would satisfy this requirement.

Third, if there are two or more test gradients in the total of all pulse sequences, at least two of such test gradients must be different. For example, one test gradient could have a height L and another test gradient could have a height $\frac{1}{2}L$ or $\frac{1}{4}L$.

Fourth, the vector addition of the output signals from all of the stages in the absence of any test gradients, after any complex scaling, must produce a resultant signal which is substantially equal to zero. It is important to note that the last criterion assumes that there are no test gradients. This last criteria requires a little explanation. The following are different examples used to show vector addition of the output signals from all stages, with complex scaling and in the absence of test gradients, producing a signal having a zero magnitude.

Specifically, it is possible to perform complex scaling on the output signals used. In this regard, complex scaling refers to both magnitude (expansion) and rotation. As a simple example, in the sequence of FIG. 5, if RF excitation pulse 46 in stage A is reduced in magnitude in such an amount that the output signal resulting therefrom at time $TE_1$ would be one-half of the height of the output signal resulting at time $TE_2$ in stage B, then when combining the two output signals by vector addition, the magnitude of the output signal at time $TE_1$ would have to be scaled up by a magnitude factor of two. Of course, when dealing with complex scaling, the operation becomes more difficult since rotation scaling is also taken into account. Generally, the complex scaling of the output signals would correspond to the complex scaling of the RF excitation pulses.

As another example of satisfying the criterion (4) above, with complex scaling, if all RF excitation pulses are positively phased, one-half of the output signals from all stages would have to be scaled by a factor of $-1$. In such case, the same resultant output signal as obtained with FIG. 5 would result.

It will be appreciated that in the preferred embodiment of FIG. 5, the complex scaling is 1:1. In effect, there is no scaling at all. However, for purposes of the present invention, and the claims hereinafter, there will always be complex scaling of the two or more output signals, even if such scaling is 1:1.

As a further example of satisfying the criterion (4) with complex scaling of 1:1, there could be three stages A–C, with the RF excitation pulses in each stage being positively phased, and with the RF excitation pulses having phases of 0°, 120° and 240°, respectively, so that the output signals from the three stages will cancel. Accordingly, the magnitude of the resultant output signal by combining the output signals from the three stages, would be zero. Alternatively, there could be four positively phased RF excitation pulses in four stages having phases of 0°, 90°, 180° and 270°, respectively.

It will be appreciated that there are numerous ways that the criterion (4) can be satisfied, and the present invention is not limited by the specific examples given herein. In any event, to produce a map of eddy currents according to the present invention, the output signals from all of the stages must be complex scaled and vector added, with the complex scaling being such that the vector addition of the output signals from each stage in the absence of the test gradients would produce a signal having zero magnitude.

It will also be appreciated that, although the present invention has been discussed with a modification of a normal spin echo pulse sequence of FIG. 4, the present invention can be used with other MR pulse sequences, such as a gradient reversal echo sequence and a stimulated echo sequence.

Having described specific preferred embodiments of the invention with reference to the accompanying drawings, it will be appreciated that the present invention is not limited to those precise embodiments, and that various changes and modifications may be effected therein by one of ordinary skill in the art without departing from the scope or spirit of the invention as defined in the appended claims.

What is claimed is:

1. A method of mapping eddy currents in magnetic resonance imaging apparatus of the type having gradient coils and RF coils, said method comprising the steps of:
   (a) applying a pulse sequence of at least two stages to said apparatus each stage including the steps of:
      (i) applying an RF excitation pulse by said RF coils;
      (ii) subsequently applying at least one imaging gradient by said gradient coils;
   (b) applying a test gradient by said gradient coils in at least one said stage before the RF excitation pulse in said stage, such that at least two test gradients are different from each other when a test gradient is applied in at least two stages;
   (c) subsequently measuring an output signal in each stage in response to said RF excitation pulses and said gradients; and
   (d) processing said output signals from all said stages to produce a map of said eddy currents, said step of processing including the step of complex scaling and vector adding said output signals from all of said stages, said complex scaling being such that vector adding said output signals from each stage in the absence of all test gradients would produce a signal having zero magnitude.

2. A method according to claim 1; wherein said step of applying a test gradient includes the step of applying a test gradient in each stage.

3. A method according to claim 1; wherein said step of subsequently measuring includes the step of measuring the output signal in each stage at a time TE after the RF excitation pulse in each stage.

4. A method according to claim 1; wherein said step of applying a test gradient includes the step of applying the test gradients in alternating stages with the same magnitude and opposite polarity.

5. A method according to claim 4; wherein said step of applying an RF excitation pulse includes the step of applying the RF excitation pulses in alternating stages with the same magnitude and opposite polarity,, and with the polarity of the RF excitation pulse and the test gradient in each stage being the same.

6. A method according to claim 1; wherein said step of applying an RF excitation pulse includes the step of applying the RF excitation pulses in alternating stages with the same magnitude and opposite polarity.

7. A method according to claim 1; wherein said step of complex scaling and vector adding produces an eddy-sensitive magnitude signal, and said step of processing includes the step of producing an original eddy-sensitive magnitude image from said eddy-sensitive magnitude signal.

8. A method according to claim 7; wherein said step of processing includes the step of offsetting said eddy-sensitive magnitude image by an offset value which is an average of noise therein, so as to produce a first modified eddy-sensitive magnitude image.

9. A method according to claim 8; wherein said step of processing includes the step o eliminating values of said first modified eddy-sensitive magnitude image which are less than a threshold value, so as to produce a second modified eddy-sensitive magnitude image.

10. A method according to claim 9; wherein said step of processing includes the step of producing a normalization magnitude image from a normalization magnitude signal, and the step of normalizing said second modified eddy-sensitive magnitude image with said normalization magnitude image, so as to produce a third modified eddy-sensitive magnitude image.

11. A method according to claim 10; wherein said normalization magnitude signal is obtained in response to the steps of:
   (a) applying a pulse sequence of said at least two stages to said apparatus, each stage including the steps of:
      (i) applying an RF excitation pulse of said first polarity by said RF coils;
      (ii) subsequently applying at least one imaging gradient by said gradient coils;
   (b) subsequently measuring an output signal in each stage in response to the RF excitation pulse and gradient therein;
   (c) processing said output signals from all said stages to produce said normalization magnitude signal.

12. A method according to claim 10; wherein said step of processing includes the step of removing a sine component of said third modified eddy-sensitive magnitude image, so as to produce a fourth modified eddy-sensitive magnitude image.

13. A method according to claim 12 wherein said step of processing includes the step of regenerating a sign of said fourth modified eddy-sensitive magnitude image by rendering said fourth modified eddy-sensitive magnitude image negative in portions thereof corresponding to portions where the original eddy-sensitive magnitude image is negative, so as to produce a fifth modified eddy-sensitive magnitude image.

14. A method according to claim 13; wherein said step of processing includes the step of unwrapping said fifth modified eddy-sensitive magnitude image to produce an image which is a map of time integral eddy induced field error expressed in terms of radians of rotation of phase.

15. A method according to claim 7; wherein said step of processing includes the step of producing a normalization magnitude image from a normalization magnitude signal, and the step of normalizing said original eddy-sensitive magnitude image with said normalization magnitude image, so as to produce a first modified eddy-sensitive magnitude image.

16. A method according to claim 15; wherein said step of processing includes the step of removing a sine component of said first modified eddy-sensitive magnitude image, so as to produce a second modified eddy-sensitive magnitude image.

17. A method according to claim 16; wherein said step of processing includes the step of regenerating a sign of said second modified eddy-sensitive magnitude image by rendering said second modified eddy-sensitive magnitude image negative in portions thereof corresponding to portions where said original eddy-sensitive magnitude image is negative, so as to produce a third modified eddy sensitive magnitude image.

18. A method according to claim 17; wherein said step of processing includes the step of unwrapping said third modified eddy-sensitive magnitude image to produce an image which is a map of time integral eddy induced field error expressed in terms of radians of rotation of phase.

19. A method of mapping eddy currents in magnetic resonance imaging apparatus of the type having gradient coils and RF coils, said method comprising the steps of:
   (a) applying a pulse sequence to said apparatus in a first excitation stage, including the steps of:

(i) applying a first test gradient of a first polarity by said gradient coils;

(ii) subsequently applying a first RF pulse of said first polarity by said RF coils;

(iii) subsequently applying at least one first imaging gradient by said gradient coils;

(b) measuring a first output signal in said first stage in response to said RF excitation pulse and said gradients;

(c) subsequently applying a pulse sequence to said apparatus in a second excitation stage, including the steps of:

(i) subsequently applying a second test gradient of a second polarity opposite to said first polarity by said gradient coils;

(ii) subsequently applying a second RF pulse of said second polarity;

(iii) subsequently applying at least one second imaging gradient by said gradient coils;

(d) measuring a second output signal in said second stage in response to said second RF excitation pulse and said second gradients; and (e) processing said first and second output signals to produce a map of said eddy currents.

20. A method according to claim 19; wherein said step of processing including the step of complex scaling and vector adding said output signals from said stages to produce an eddy-sensitive magnitude signal, said complex scaling being such that vector adding said output signals from each stage in the absence of all test gradients would produce a signal having zero magnitude.

21. A method according to claim 20; wherein said step of processing includes the step of producing an original eddy sensitive magnitude image from said eddy-sensitive magnitude signal.

22. A method according to claim 21; wherein said step of processing includes the step of offsetting said eddy-sensitive magnitude image by an offset value which is an average of noise therein, so as to produce a first modified eddy-sensitive magnitude image.

23. A method according to claim 22; wherein said step of processing includes the step of eliminating values of said first modified eddy-sensitive magnitude image which are less than a threshold value, so as to produce a second modified eddy-sensitive magnitude image.

24. A method according to claim 23; wherein said step of processing includes the step of producing a normalization magnitude image from a normalization magnitude signal, and the step of normalizing said second modified eddy-sensitive magnitude image with said normalization magnitude image, so as to produce a third modified eddy-sensitive magnitude image.

25. A method according to claim 24; wherein said normalization magnitude signal is obtained in response to the steps of:

(a) applying a pulse sequence of said at least two stages to said apparatus each stage including the steps of:

(i) applying an RF excitation pulse of said first polarity by said RF coils;

(ii) subsequently applying at least one imaging gradient by said gradient coils;

(b) subsequently measuring an output signal in each stage in response to the RF excitation pulse and gradient therein;

(c) processing said output signals from all said stages to produce said normalization magnitude signal.

26. A method according to claim 24; wherein said step of processing includes the step of removing a sine component of said third modified eddy-sensitive magnitude image, so as to produce a fourth modified eddy-sensitive magnitude image.

27. A method according to claim 26; wherein said step of processing includes the step of regenerating a sign of said fourth modified eddy-sensitive magnitude image by rendering said fourth modified eddy-sensitive magnitude image negative in portions thereof corresponding to portions where said original eddy-sensitive magnitude image is negative, so as to produce a fifth modified eddy-sensitive magnitude image.

28. A method according to claim 27; wherein said step of processing includes the step of unwrapping said fifth modified eddy-sensitive magnitude image to produce an image which is a map of time integral eddy induced field error expressed in terms of radians of rotation of phase.

29. A method according to claim 21; wherein said step of processing includes the step of producing a normalization magnitude image from a normalization magnitude signal, and the step of normalizing said original eddy-sensitive magnitude image with said normalization magnitude image, so as to produce a first modified eddy-sensitive magnitude image.

30. A method according to claim 29; wherein said step of processing includes the step of removing a sine component of said first modified eddy-sensitive magnitude image, so as to produce a second modified eddy-sensitive magnitude image.

31. A method according to claim 30; wherein said step of processing includes the step of regenerating a sign of said second modified eddy-sensitive magnitude image by rendering said second modified eddy-sensitive magnitude image negative in portions thereof corresponding to portions where said original eddy-sensitive magnitude image is negative, so as to produce a third modified eddy-sensitive magnitude image.

32. A method according t claim 31; wherein said step of processing includes the step of unwrapping said third modified eddy-sensitive magnitude image to produce an image which is a map of time integral eddy induced field error expressed in terms of radians of rotation of phase.

33. Apparatus for mapping eddy currents in magnetic resonance imaging apparatus of the type having gradient coils and RF coils, said method comprising the steps of:

(a) means for applying a pulse sequence of at least two stages to said apparatus, said means including:

(i) means for applying an RF excitation pulse in each stage to said RF coils;

(ii) means for applying a signal to said gradient coils to produce at least one imaging gradient subsequent to said RF excitation pulse in each stage and to produce a test gradient in at least one said stage before the RRF excitation pulse in said stage, such that at least two test gradients are different from each other when a test gradient is applied in at least two stages;

(b) means for measuring an output signal in each stage in response to said RF excitation pulses and said gradients; and (c) means for processing said output signals from all said stages to produce a map of said eddy currents by complex scaling and vector adding said output signals from all of said stages, said complex scaling being such that vector adding said output signals from each stage in the absence of said at least one test gradient would produce a signal having zero magnitude.

* * * * *